(12) United States Patent
Viswanathan et al.

(10) Patent No.: US 9,614,046 B2
(45) Date of Patent: Apr. 4, 2017

(54) SEMICONDUCTOR DEVICES WITH A THERMALLY CONDUCTIVE LAYER

(71) Applicant: Freescale Semiconductor, Inc., Austin, TX (US)

(72) Inventors: Lakshminarayan Viswanathan, Phoenix, AZ (US); Bruce M. Green, Gilbert, AZ (US); Darrell G. Hill, Chandler, AZ (US); L. M. Mahalingam, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/173,487

(22) Filed: Jun. 3, 2016

(65) Prior Publication Data

US 2016/0308010 A1    Oct. 20, 2016

Related U.S. Application Data

(63) Continuation of application No. 14/249,538, filed on Apr. 10, 2014, now Pat. No. 9,362,198.

(51) Int. Cl.

| | |
|---|---|
| *H01L 31/102* | (2006.01) |
| *H01L 29/417* | (2006.01) |
| *H01L 23/367* | (2006.01) |
| *H01L 21/762* | (2006.01) |
| *H01L 21/3205* | (2006.01) |

(Continued)

(52) U.S. Cl.
CPC ........ *H01L 29/4175* (2013.01); *H01L 21/042* (2013.01); *H01L 21/0475* (2013.01); *H01L 21/28* (2013.01); *H01L 21/32051* (2013.01); *H01L 21/762* (2013.01); *H01L 23/367* (2013.01); *H01L 23/3677* (2013.01); *H01L 23/373* (2013.01); *H01L 23/481* (2013.01); *H01L 29/2003* (2013.01); *H01L 29/66462* (2013.01); *H01L 29/7786* (2013.01); *H01L 2924/0002* (2013.01)

(58) Field of Classification Search
None
See application file for complete search history.

(56) References Cited

U.S. PATENT DOCUMENTS

| | | |
|---|---|---|
| 5,767,578 A | 6/1998 | Chang et al. |
| 6,288,426 B1 | 9/2001 | Gauthier |

(Continued)

FOREIGN PATENT DOCUMENTS

EP        1739736 A1    1/2007

*Primary Examiner* — Sonya D McCall Shepard
(74) *Attorney, Agent, or Firm* — Bruce M. Green

(57) ABSTRACT

An embodiment of a semiconductor device includes a semiconductor substrate that includes a host substrate and an upper surface, an active area, a substrate opening in the semiconductor substrate that is partially defined by a recessed surface, and a thermally conductive layer disposed over the semiconductor substrate that extends between the recessed surface and a portion of the semiconductor substrate within the active area. A method for fabricating the semiconductor device includes defining an active area, forming a gate electrode over a channel in the active area, forming a source electrode and a drain electrode in the active area on opposite sides of the gate electrode, etching a substrate opening in the semiconductor substrate that is partially defined by the recessed surface, and depositing a thermally conductive layer over the semiconductor substrate that extends between the recessed surface and a portion of the semiconductor substrate over the channel.

19 Claims, 17 Drawing Sheets

(51) Int. Cl.
*H01L 21/04* (2006.01)
*H01L 21/28* (2006.01)
*H01L 29/778* (2006.01)
*H01L 29/66* (2006.01)
*H01L 29/20* (2006.01)
*H01L 23/48* (2006.01)
*H01L 23/373* (2006.01)

(56) References Cited

U.S. PATENT DOCUMENTS

| | | |
|---|---|---|
| 6,956,250 B2 | 10/2005 | Borges et al. |
| 7,566,913 B2 | 7/2009 | Therrien et al. |
| 7,656,010 B2 | 2/2010 | Murata et al. |
| 7,679,193 B2 | 3/2010 | McTeer |
| 7,859,087 B2 | 12/2010 | Murata et al. |
| 8,039,301 B2 | 10/2011 | Kub et al. |
| 8,497,513 B2 | 7/2013 | Kohn et al. |
| 8,643,062 B2 | 2/2014 | Parikh et al. |
| 2006/0273347 A1 | 12/2006 | Hikita et al. |
| 2007/0126026 A1 | 6/2007 | Ueno et al. |
| 2012/0286289 A1 | 11/2012 | Dipalo et al. |

SEMICONDUCTOR DEVICES WITH A THERMALLY CONDUCTIVE LAYER

RELATED APPLICATIONS

This application is a continuation of co-pending, U.S. patent application Ser. No. 14/249,538 filed on Apr. 10, 2014, entitled "Semiconductor Devices with a Thermally Conductive Layer and Methods of Their Fabrication," which is incorporated herein by reference.

TECHNICAL FIELD

Embodiments of the subject matter described herein relate generally to semiconductor devices with a thermally conductive layer and methods for fabricating such devices.

BACKGROUND

High power microwave transistors find application in power amplifiers (PAs) and other circuit applications. Microwave field effect transistors include aluminum gallium nitride/gallium nitride heterojunction field effect transistors (AlGaN/GaN HFET's), gallium arsenide pseudomorphic high electron mobility transistors (GaAs pHEMT's), gallium arsenide metal-semiconductor field effect transistors (GaAs MESFET's), and silicon laterally diffused metal-oxide semiconductor (Si-LDMOS) transistors. Field effect transistors used in microwave power amplifiers generate heat when non-zero voltage and current simultaneously appear on the drains of amplifier final stage transistors. Therefore, the transistors must be able to efficiently dissipate heat that is generated during operation. In addition, the heat generated by the circuitry increases the temperature of the heat sink used to dissipate heat generated by the transistors. For example, a 100 watt (W) final stage transistor that has a thermal resistance, $R_{JC}$, of 1.5 degrees Celsius per watt (° C./W) dissipating 100 W of average power, while operating with a heat sink temperature of 100° C., would reach a maximum junction temperature of 250° C. Such a junction temperature may exceed the temperature rating of the device channel and present device reliability problems. Therefore, transistors lower values of $R_{JC}$ are desired. More specifically, designers desire structures and methods that reduce the thermal resistance of such devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
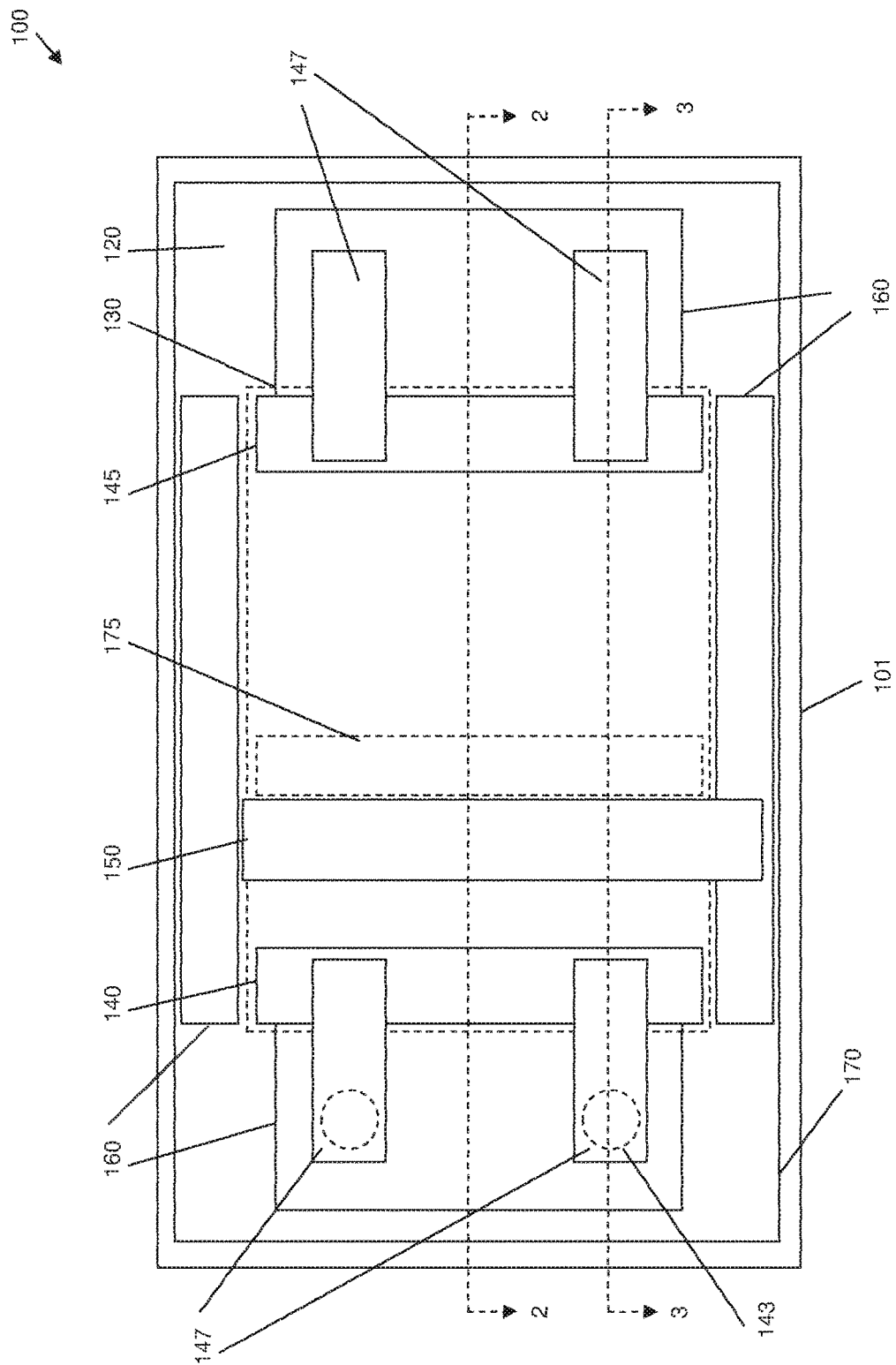
FIG. 1 is a top view of a gallium nitride (GaN) transistor device in accordance with an embodiment.

FIG. 1 is a top view of an exemplary GaN transistor 100 with a thermally conductive layer in accordance with an embodiment. In an embodiment, GaN transistor 100 includes a semiconductor substrate 101, one or more substantially insulating or semi-insulating isolation regions 120, one or more active areas 130, a source electrode 140, a drain electrode 145, a gate electrode 150, multiple substrate openings 160, and a thermally conductive layer 170 in contact with substrate openings 160. According to an embodiment, thermally conductive layer 170 overlies active area 130, source electrode 140 (i.e., a current-carrying electrode), drain electrode 145 (i.e., another current-carrying electrode), gate electrode 150, and substrate openings 160. For clarity of illustration, although those structures may be hidden below thermally conductive layer 170, they are depicted with solid lines, rather than dashed lines. Further, although device 100 is shown to include four substrate openings 160, other device embodiments may include more or fewer substrate openings, and/or the substrate openings may be located in different portions of the device than those depicted in FIGS. 1-3.

Figure 2:
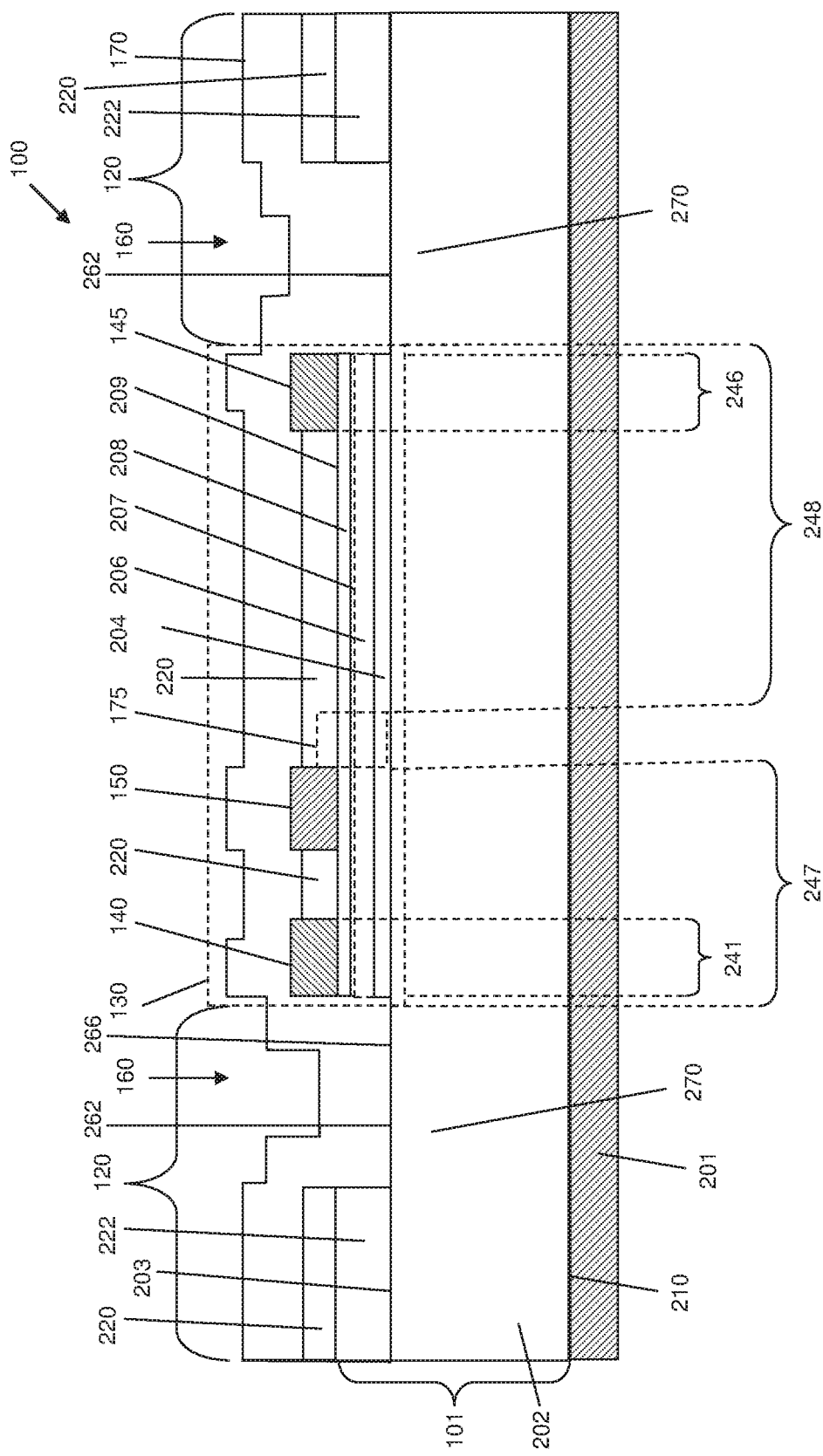
FIG. 2 is a cross sectional view of the GaN transistor device of FIG. 1 along line 2-2, in accordance with an embodiment.

According to an embodiment, and as will be explained more fully in connection with FIG. 2, isolation region(s) 120 separates the one or more active areas 130 from other nearby active area(s), thus isolating individual devices from one another. As will be detailed further in the descriptions of FIG. 5 and method step 500, isolation region(s) 120 may be created by ion bombardment or other suitable technique(s).

According to an embodiment, source electrode 140 and drain electrode 145 are formed over and in contact with semiconductor 101, within the active area 130. Gate electrode 150 is formed between source electrode 140 and drain electrode 145. According to an embodiment, the substrate opening(s) 160 are formed within semiconductor substrate 101 adjacent source electrode 140, and/or drain electrode 145, and/or gate electrode 150.

More particularly, according to an embodiment, the substrate opening(s) 160 may be formed substantially within isolation region 120 adjacent to gate electrode 150, source electrode 140, and/or drain electrode. As will be explained in further detail in connection with FIGS. 2 and 3, thermally conductive layer 170 is formed over semiconductor substrate 101 and over (e.g., within) substrate openings 160 formed within semiconductor substrate 101. Heat generated in the active area 130 during operation may be primarily generated in a heat generating region 175 between gate electrode 150 and drain electrode 145, adjacent the gate electrode 150. As used herein, the term "heat generating region" refers to a location of substrate 101 in which a significant amount of heat may be generated while device 100 is in operation (e.g., during times when non-zero voltage is applied to one or more of source electrode 140, drain electrode 145, or gate electrode 150). Heat generating region 175 may be included in other embodiments, whether or not the transistor is in operation. According to an embodiment, this heat is transported laterally from heat generating region 175 through the thermally conductive layer 170 to a thermal reservoir, such as a portion of substrate 101 (e.g., a portion of a host substrate 202, FIG. 2) that is accessed by a portion of the thermally conductive layer 170 that contacts the thermal reservoir through substrate openings 160. Heat may also be transferred from heat generating region 175 to source electrode 140, interconnect metal 147, gate electrode 150, and other structures proximate to heat generating region 175.

According to an embodiment, connections to source electrode 140 and drain electrode 145 may be accomplished using interconnect metal 147. In an embodiment, interconnect metal 147 includes a plurality of parallel electrical connections to source electrode 140 and drain electrode 145, and interconnect metal 147 may be used to reduce the effective resistance of source electrode 140 and drain electrode 145. This allows the designer to maintain short lateral dimensions for source electrode 140 and drain electrode 145 and overlying thermally conductive layer 170 so as to reduce the distance between heat generating region 175 and the thermal reservoir accessed via the thermally conductive layer 170 through substrate openings 160. In some embodiments, interconnect metal 147 may be disposed over substrate openings 160. In an embodiment, and as will be explained more fully in connection with FIG. 3, one or more through wafer vias 143 may be placed within substrate opening 160 to accomplish connection between, for example, source electrode 140 and a back-metal layer (e.g., layer 201, FIG. 2) on a lower surface of semiconductor substrate 101.

FIG. 2 is a cross section view of GaN transistor 100 along cut line 2-2 showing further details of the device 100. According to an embodiment, device 100 as viewed along cut line 2-2 includes semiconductor substrate 101, isolation region 120, active area 130, source electrode 140, drain electrode 145, a first dielectric layer 220, multiple substrate openings 160, thermally conductive layer 170, and a back-metal layer 201.

Semiconductor substrate 101 may include a host substrate 202, a buffer layer 204, a channel layer 206, a barrier layer 208, an upper surface 209, and a lower surface 210. In an embodiment, host substrate 202 includes an upper surface 203 and includes silicon carbide (SiC). In other embodiments, host substrate 202 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials. Buffer layer 204 is formed on upper surface 203 of host substrate 202. Buffer layer 204 may include one or more group III-N semiconductor layers and is supported by host substrate 202. Each of the semiconductor layers of buffer layer 204 may include an epitaxially grown group III nitride epitaxial layer, for example. The group-III nitride epitaxially grown layers that make up buffer layer 204 may be nitrogen (N)-face or gallium (Ga)-face material, for example. In other embodiments, the semiconductor layers of buffer layer 204 may not be epitaxially grown. In still other embodiments, the semiconductor layers of buffer layer 204 may include Si, GaAs, InP, or other suitable materials.

Buffer layer 204 may include at least one AlGaN mixed crystal layer having a composition denoted by $Al_XGa_{1-X}N$ with an aluminum mole fraction, X, that can take on values between 0 and 1. The total thickness of buffer layer 204 with all of its layers may be between about 200 angstroms and about 100,000 angstroms although other thicknesses may be used. A limiting X value of 0 yields pure GaN while a value of 1 yields pure aluminum nitride (AlN). In an embodiment, buffer layer 204 may include a nucleation region comprised of AlN. The nucleation region starts at the interface between the host substrate 202 and buffer layer 204, and extends about 100 angstroms to about 2000 angstroms into buffer layer 204. Buffer layer 204 may include additional $Al_XGa_{1-X}N$ layers formed over the nucleation region. The thickness of the additional $Al_XGa_{1-X}N$ layer(s) may be between about 100 angstroms and about 50,000 angstroms though other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers where the one or more GaN layers are intentionally doped with dopants that may include iron (Fe), chromium (Cr), carbon (C) or other suitable dopants that render buffer layer 204 substantially insulating or high resistivity. The dopant concentration may be between about $10^{17}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments, the additional layers may be configured as a superlattice where the additional layers include a series of alternating NID or doped $Al_XGa_{1-X}N$ layers where the value of X takes a value between 0 and 1. In still other embodiments, buffer layer 204 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms though other thicknesses may be used.

In an embodiment, channel layer 206 is formed over buffer layer 204. Channel layer 206 may include one or more group III-N semiconductor layers and is supported by buffer layer 204. Channel layer 206 may include an $Al_XGa_{1-X}N$ layer where X takes on values between 0 and 1. In an embodiment, channel layer 206 is configured as GaN (X=0) although other values of X may be used without departing from the scope of the inventive subject matter. The thickness of channel layer 206 may be between about 50 angstroms and about 10,000 angstroms, though other thicknesses may be used. Channel layer 206 may be NID or, alternatively, may include Si, germanium (Ge), C, Fe, Cr, or other suitable dopants. The dopant concentration may be between about $10^{16}$ and about $10^{19}$ cm$^{-3}$ though other higher or lower concentrations may be used. In other embodiments, channel layer 206 may include NID or doped $In_YGa_{1-Y}N$, where Y, the indium mole fraction, may take a value between 0 and 1.

Barrier layer 208 is formed over channel layer 206 in accordance with an embodiment. Barrier layer 208 may include one or more group III-N semiconductor layers and is supported by channel layer 206. Barrier layer 208 may have a larger bandgap and/or larger spontaneous polarization than channel layer 206 and, when barrier layer 208 is over channel layer 206, a channel 207 is created in the form of a two dimensional electron gas (2-DEG) within channel layer 206 adjacent the interface between channel layer 206 and barrier layer 208. In addition, tensile strain between barrier layer 208 and channel layer 206 may cause additional piezoelectric charge to be introduced into the 2-DEG and channel 207. The first layer of barrier layer 208 may include at least one NID $Al_XGa_{1-X}N$ layer where X takes on values between 0 and 1. In some embodiments, X may take a value of 0.1 to 0.35, although other values of X may be used. The thickness of the first layer of barrier layer 208 may be between about 50 angstroms and about 1000 angstroms though other thicknesses may be used. Barrier layer 208 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used. There may be an additional AlN interbarrier layer (not shown) formed between channel layer 206 and barrier layer 208, in some embodiments. The AlN interbarrier layer may introduce additional spontaneous and piezoelectric polarization, increasing the channel charge and improving the electron confinement of the resultant 2-DEG. In other embodiments, barrier layer 208 may include indium aluminum nitride (InAlN) layers, denoted In$_Y$Al$_{1-Y}$N, where Y, the indium mole fraction, may take a value between about 0.1 and about 0.2 though other values of Y may be used. In the case of an InAlN barrier, the thickness of barrier layer 208 may be between about 50 angstroms and about 2000 angstroms though other thicknesses may be used. In the case of using InAlN to form barrier layer 208, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

A cap layer (not shown) may be formed over barrier layer 208. The cap layer presents a stable surface for semiconductor substrate 101 and serves to protect the upper surface 209 of semiconductor substrate 101 from chemical and environmental exposure incidental to wafer processing. The cap layer may include one or more group III-N semiconductor layers and is supported by barrier layer 208. In an embodiment, the cap layer includes GaN. The thickness of the cap layer may be between about 5 angstroms and about 100 angstroms though other thicknesses may be used. The cap layer may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used.

Without departing from the scope of the inventive subject matter, it should be appreciated that the choice of materials and arrangement of layers to form semiconductor substrate 101 is exemplary. The inclusion of host substrate 202, buffer layer 204, channel layer 206, and barrier layer 208 into semiconductor substrate 101 is exemplary and the function and operation of the various layers may be combined and may change depending on the materials used in any specific embodiment. In other embodiments using N-polar materials (not shown), channel layer 206 may be disposed over barrier layer 208 to create a 2-DEG and channel directly underneath an optional GaN cap and gate electrode 150. Still further embodiments may include semiconductor layers formed from materials including GaAs, indium phosphide (InP), aluminum gallium arsenide (AlGaAs), indium gallium phosphide (InGaP), indium gallium arsenide (InGaAs), and aluminum indium arsenide (AlInAs) to form semiconductor substrate 101.

One or more isolation regions 120 may be formed within semiconductor substrate 101 to define an active area 130 proximate to upper surface 209 of semiconductor substrate 101, according to an embodiment. Isolation regions 120 may be formed via an implantation procedure configured to damage the epitaxial and/or other semiconductor layers to create high resistivity semiconductor regions 222 of semiconductor substrate 101, rendering semiconductor substrate 101 high resistivity or semi-insulating in high resistivity semiconductor regions 222 while leaving the crystal structure intact in the active area 130. In other embodiments, isolation regions 120 may be formed by removing one or more of the epitaxial and/or other semiconductor layers of semiconductor substrate 101 in areas corresponding to the isolation regions 120, thus removing channel 207 in the isolation regions 120, rendering the remaining layers of semiconductor substrate 101 semi-insulating and leaving behind active area 130 "mesas" surrounded by high resistivity or semi-insulating isolation regions 120.

In an embodiment, first dielectric layer 220 may be formed over active area 130 and isolation regions 120. According to an embodiment, and as will be described later in conjunction with the method depicted in FIG. 4 describing step 400, first dielectric layer 220 may include one or more substantially insulating dielectric layers. In some embodiments, first dielectric layer 220 may include thermally conductive material such as diamond, poly-diamond, AlN, BN, SiC, or other high thermal conductivity substantially insulating or semi insulating materials with a thermal conductivity greater than 200 W/m-K. In other embodiments, first dielectric layer 220 may include silicon nitride, silicon dioxide, hafnium oxide, or other insulating materials with thermal conductivities less than about 200 W/m-K. In any case, for maximum heat transfer from heat generating region 175 to thermally conductive layer 170 it may be desired to reduce thermal interface by using materials with thermal conductivity greater than about 200 W/m-K and/or minimizing the thickness of first dielectric layer 220 to values in the range of about 100 angstroms to about 3000 angstroms, though other thickness values may be used, depending on the thermal conductivity of the material used to realize first dielectric layer 220.

In an embodiment, current carrying electrodes such as source electrode 140 and drain electrode 145 may be formed over and in contact with semiconductor substrate 101 adjacent the gate electrode 140 in the active area 130. According to an embodiment source electrode 140 and drain electrode 145 are created in openings made in first dielectric layer 220. Source electrode 140 may have a first length 241 and drain electrode 145 have may have a second length 246. First length 241 and second length 246 are selected to make first and second thermal path distances 247 and 248 from heat generating region 175 to substrate opening(s) 160 relatively short (e.g., as short as possible). According to an embodiment, source electrode length 241 and drain electrode length 246 may be between about 1 micron and about 40 microns though other lengths may be used. In an embodiment, source electrode length 241, drain electrode length 246, and the spacing between source electrode 140, gate electrode 150, and drain electrode 145 may be chosen to achieve first and second thermal path distances 247 and 248 of between about 2 and about 30 microns (or less than about 30 microns), although other lengths may be used. In another embodiment, source electrode length 241, drain electrode length 246, and the spacing between source electrode 140, gate electrode 150, and drain electrode 145 may be chosen to achieve first and second thermal path distances 247 and 248 of between about 5 and about 10 microns, although other lengths may be used.

In an embodiment, source electrode 140 and drain electrode 145 are created from ohmic junctions to the channel 207. As will be described later, in an embodiment of a method for forming source electrode 140 and drain electrode 145, as depicted and described in FIGS. 6-8 and steps 600-800 below, low work function materials may be combined with high conductivity materials and refractory barrier materials in a metal stack to form source electrode 140 and drain electrode 145 coupled to channel 207, according to an embodiment. Source electrode 140 and drain electrode 145 may be formed over and in contact with upper surface 209 of semiconductor substrate 101, according to an embodiment. In other embodiments, source electrode 140 and drain electrode 145 may be recessed below upper surface 209 of semiconductor substrate 101 and extend partially into barrier layer 208. In still other embodiments, ion implantation of Si, Ge, or other appropriate dopants may be used to form ohmic contact to the channel 107.

Figure 9:
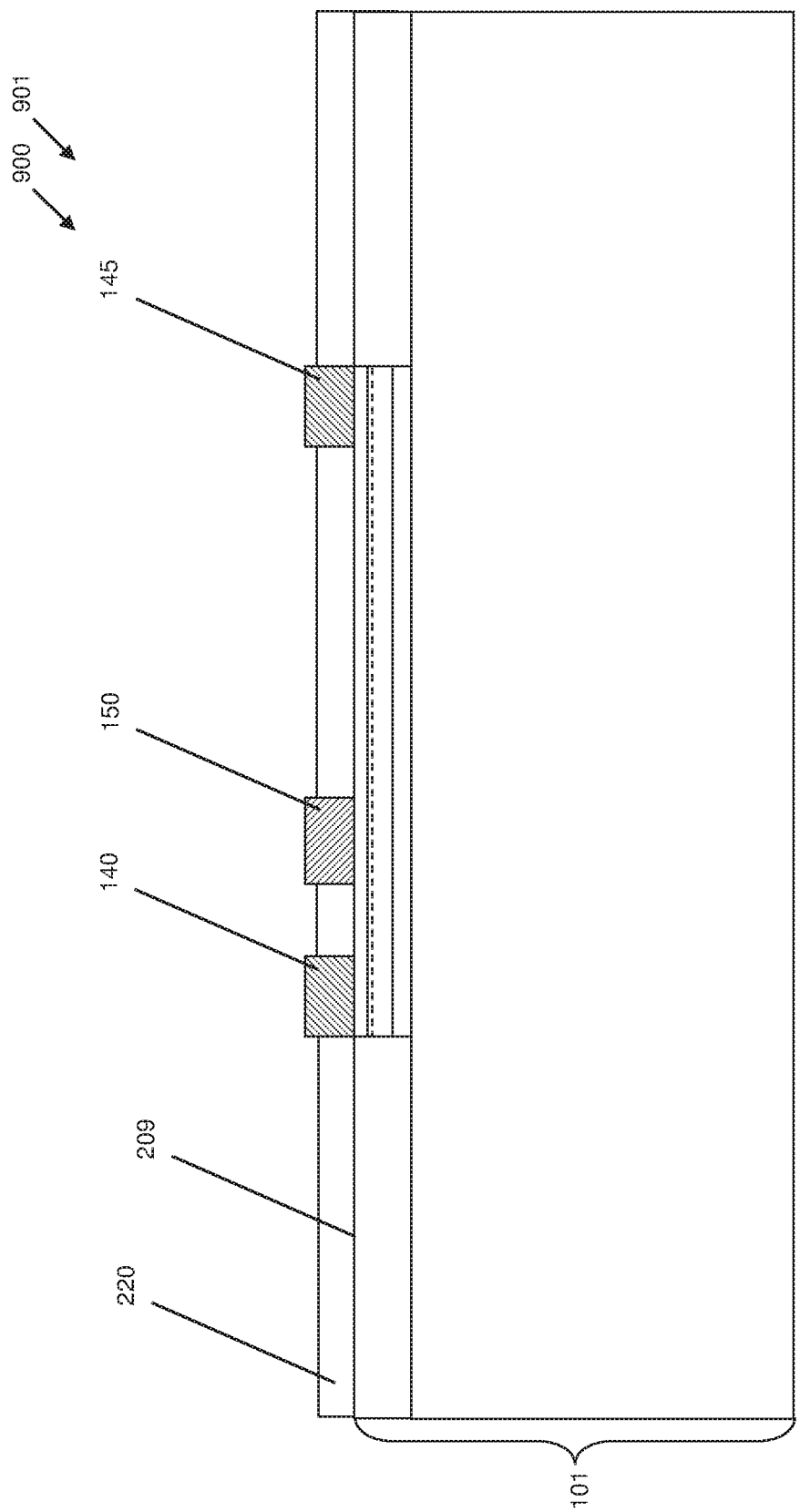

In an embodiment, gate electrode 150 is formed over semiconductor substrate 101 in active area 130. Gate electrode 150 is electrically coupled to the channel 207 through upper surface 209 and barrier layer 208. Changes to the electric potential on gate electrode 150 shifts the quasi Fermi level for barrier layer 208 compared to the quasi Fermi level for channel layer 206 and thereby modulates the electron concentration in channel 207 within semiconductor substrate 101 under gate electrode 150. In this embodiment, gate electrode 150 is configured as a Schottky gate and may be formed over and directly in contact with upper surface 209 of semiconductor substrate 101 using a Schottky material layer and a conductive metal layer. A conductive, low stress metal is deposited over the Schottky material layer to form gate electrode 150, in an embodiment. The gate electrode 150 may have a square cross-sectional shape as shown or may have a T-shaped cross section with a vertical stem over semiconductor substrate 101 and a wider portion over the vertical stem in other embodiments. In other embodiments, gate electrode 150 may be recessed through upper surface 209 of semiconductor substrate 101 and extend partially into barrier layer 208, increasing the electrical coupling of gate electrode 150 to channel 107 through barrier layer 208. As will be described later, in an embodiment of a method for forming gate electrode 150, as depicted in FIG. 9 and described in conjunction with step 900 below, Schottky or other suitable materials may be combined with highly conductively materials in a metal stack to form a gate electrode 150 for a low loss gate electrode electrically coupled to channel 207, according to an embodiment. In other embodiments, gate electrode 150 may be formed over a gate dielectric or gate oxide forming a metal-insulator-semiconductor (MIS) junction or metal oxide semiconductor (MOS) junction, electrically coupling to the channel 107 through the gate dielectric or gate oxide layer.

In an embodiment, substrate opening(s) 160 are formed in semiconductor substrate 101, adjacent source electrode 140, drain electrode 145, and/or gate electrode 150. According to an embodiment, each substrate opening 160 is partially defined by a recessed surface 262 of semiconductor substrate 101 at the bottom of the substrate opening 160, where the recessed surface 262 is below surface 209 and may be defined by etching into semiconductor substrate 101. In an embodiment, substrate opening 160 may extend vertically through first dielectric layer 220, and semiconductor layers 208, 206, and 204 of semiconductor substrate 101, and terminate on upper surface 203 of host substrate 202 of semiconductor substrate 101, forming recessed surface 262 defining the bottom of substrate opening 160. In other embodiments, recessed surface 262 defining the bottom of substrate opening 160 may terminate within or on one of semiconductor layers 208, 206, 204 over host substrate 202, within semiconductor substrate 101. In still other embodiments, substrate opening 160 may extend into host substrate 202 below upper surface 203 to a point above lower surface 210 of semiconductor wafer 101. According to an embodiment, in the finished device, the substrate opening 160 may not extend all the way through to the lower surface 210 of the host substrate 202. Instead, in the finished device, a portion of the host substrate 202 is present between the recessed surface 262 defining the bottom of the substrate opening 160 and the lower surface 210 of the host substrate 202 (or between the portions of the thermally conductive layer 170 that contact the recessed surface 262 and lower surface 210). In still other further embodiments (not shown), substrate opening 160 may extend completely through host substrate 202 to lower surface 210 of semiconductor wafer 101. Without departing from the scope of the inventive subject matter, in other embodiments, recessed surface 262 may be formed in isolation region 120 in an embodiment with etched isolation takes the place of substrate opening 160. In these other embodiments, the etched isolation region 120 that produces recessed surface 262 may be below upper surface 209 of semiconductor substrate 101, may be coplanar with upper surface 203 of host substrate 202, or may be below upper surface 203 of host substrate 202.

According to an embodiment, thermally conductive layer 170 thermally couples heat generating region 175 with a thermal reservoir that is contacted through substrate opening 160. As used herein, a "thermal reservoir" means a portion of the semiconductor substrate 101 and/or other structures that contact thermally conductive layer 170, that are configured to receive and dissipate substantial quantities of heat that are produced in heat generating region 175 and transferred to the thermal reservoir through thermally conductive layer 170. For example, regions 270 of semiconductor substrate 101 underlying recessed surface 262 may function as thermal reservoirs for receiving and dissipating heat produced in heat generating region 175 and conveyed to regions 270 through thermally conductive layer 170. In addition, packaging materials bonded to back-metal layer 201 may also contribute to the heat capacity of the thermal reservoirs created by regions 270. Thermally conductive layer 170 may include diamond, graphite, diamond-like materials, SiC, boron nitride (BN), gold (Au), copper (Cu), silver (Ag), Al, a combination of these, or other suitable materials. In an embodiment, the thermal conductivity of thermally conductive layer 170 is greater than about 200 W/m-K although other thermal conductivity values may be used. Other materials may also be used to form thermally conductive layer 170. According to an embodiment, thermally conductive layer 170 may be formed from one or more layers of these thermally conductive materials. Some applications favor avoiding introducing additional non-insulating layers into the active region to prevent additional device capacitance. Accordingly, thermally conductive layer 170 may be configured to include only substantially insulating materials (e.g. diamond, insulating graphite, BN, SiC, and diamond like materials) in both the active area 130 and the isolation region 130, in an embodiment. In other embodiments, thermally conductive layer 170 may be formed from more than one layer(s) of material that may include both substantially insulating (e.g. diamond, insulating graphite, BN, SiC, and diamond like materials) and substantially non-insulating (e.g. Au, Cu, conductive graphite, Al, or other) materials. According to these embodiments, thermally conductive layer 170 may be formed by depositing the substantially non-insulating materials over the substantially insulating materials. The substantially non-insulating materials may be patterned (e.g. by etching or selectively depositing of the non-insulating materials) to remove non-insulating materials in the active area 130. In other embodiments, the substantially non-insulating layer(s) may be retained in the active area so long as there is a substantially insulating layer over and in contact with the active area 130. The total thickness of thermally conductive layer 170 may between about 500 angstroms and about 200,000 angstroms though other thicknesses may be used. A nucleation layer creating a thermal interface 266 between the thermally conductive layer 170 and the structures that it contacts may form when thermally conductive layer 170 is deposited. The thermal interface 266 creates a thermal boundary resistance (TBR) between thermally conductive layer 170 and the portion of semiconductor substrate 101 underlying recessed surface 264. In some embodiments, the TBR may be between about 1 square meters-Kelvin per gigawatt ($m^2K/GW$) and about 100 $m^2K/GW$. In other embodiments, the TBR may be between about 10 $m^2K/GW$ and about 30 $m^2K/GW$, although other TBR values may be used. The TBR between thermally conductive layer 170 and heat generating region 175 (including possibly intervening first dielectric layers 220) may be between about 1 $m^2K/GW$ and about 100 $m^2K/GW$, although other TBR values may be used In an embodiment, back-metal layer 201 may be formed on lower surface 210 of semiconductor substrate 101. Back-metal layer 201 creates a ground plane and, as will be explained in connection with FIG. 3, may be connected to circuitry proximate the top surface 209 of the semiconductor substrate 101 using through wafer vias 143 shown in FIGS. 1 and 3.

Figure 16:
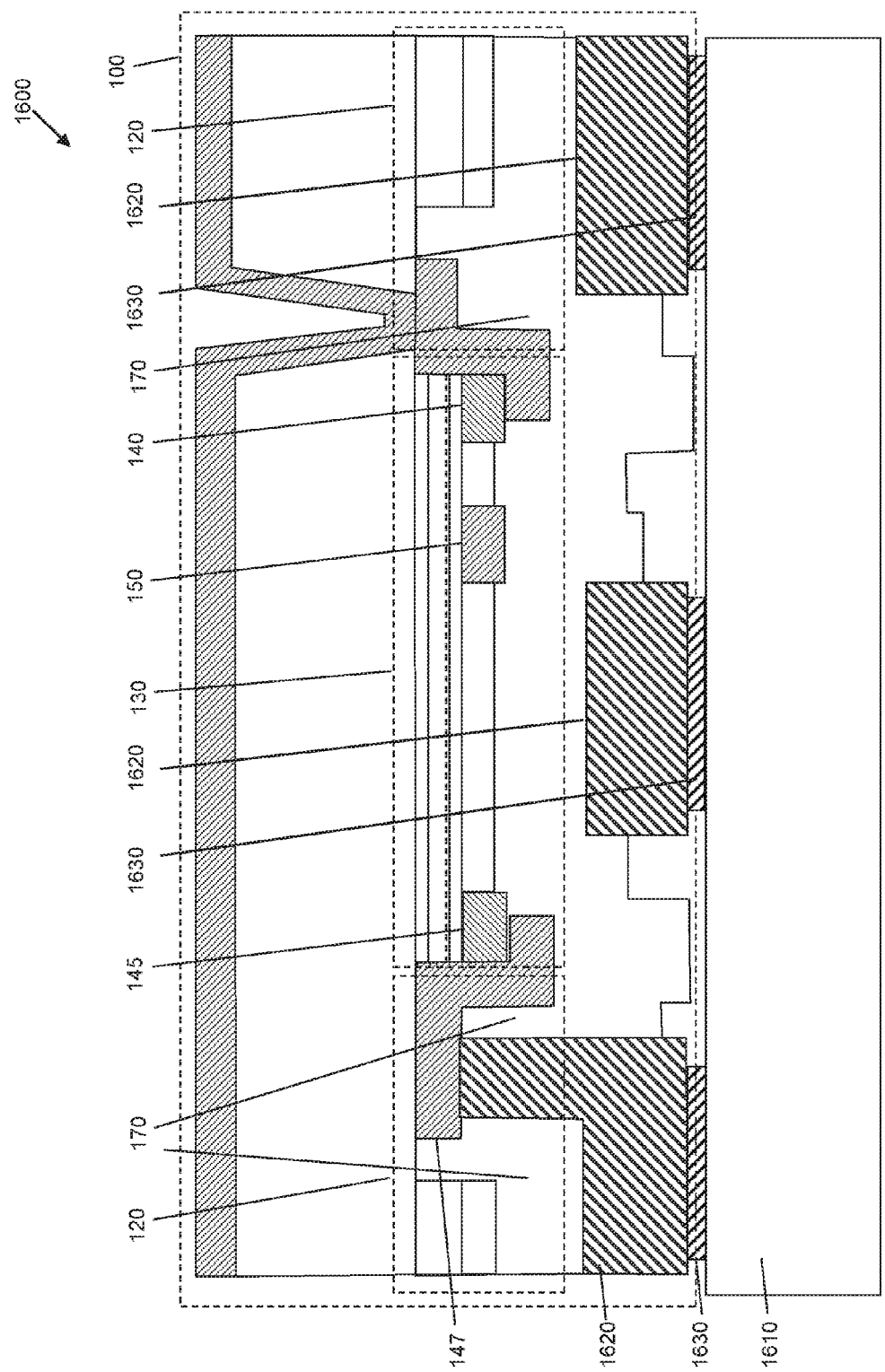
FIG. 16 is a cross sectional view of the GaN transistor in a flip chip configuration, in accordance with an embodiment.

FIG. 16 shows GaN device 100 in a "flip-chip" configuration according to an embodiment. Without departing from the scope of the inventive subject matter, in these embodiments, structures 1620 formed above thermally conductive layer 170 may act as a thermal reservoir and may be used to remove heat from GaN device 100. For example GaN device 100 may be "flip-chip" bonded to a bonding substrate 1610, according to an embodiment. In an embodiment, flip chip bonding entails bonding or otherwise coupling suitable structures above semiconductor substrate 101 to a bonding substrate 1610. The bonding substrate 1610 may include one or more of diamond, alumina, beryllium oxide, Cu, Au, Cu coin, printed circuit board material, or other suitable materials. In these embodiments, bonding pads 1620 may be fabricated over thermally conductive layer 170 either within active area 130 or within isolation region 120. In some embodiments, the bonding pads 1620 are formed using interconnect metal 147. In some embodiments, the bonding pads 1620 may be electrically coupled to one or more of gate electrode 150, source electrode 140, or drain electrode 145. In other embodiments, the thermally conductive bonding pads 1620 may be electrically isolated from one or more of gate electrode 150, source electrode 140, and drain electrode 145. The thermally conductive bond pads 1620 may include one or more of Au, Al, Cu, diamond, SiC, or other suitable material. The thermally conductive bonding pads 1620 may be bonded to the substrate using an appropriate solder layer 1630, according to an embodiment. In an embodiment, the solder layer 1630 may include Au—Sn eutectic, lead tin solder, silver sintering, or other suitable solder materials. In these flip chip embodiments, the bonding pads 1620, solder layer 1630, and bonding substrate 1610 become part of the thermal reservoir that is thermally coupled to thermally conductive layer 170.

Figure 3:
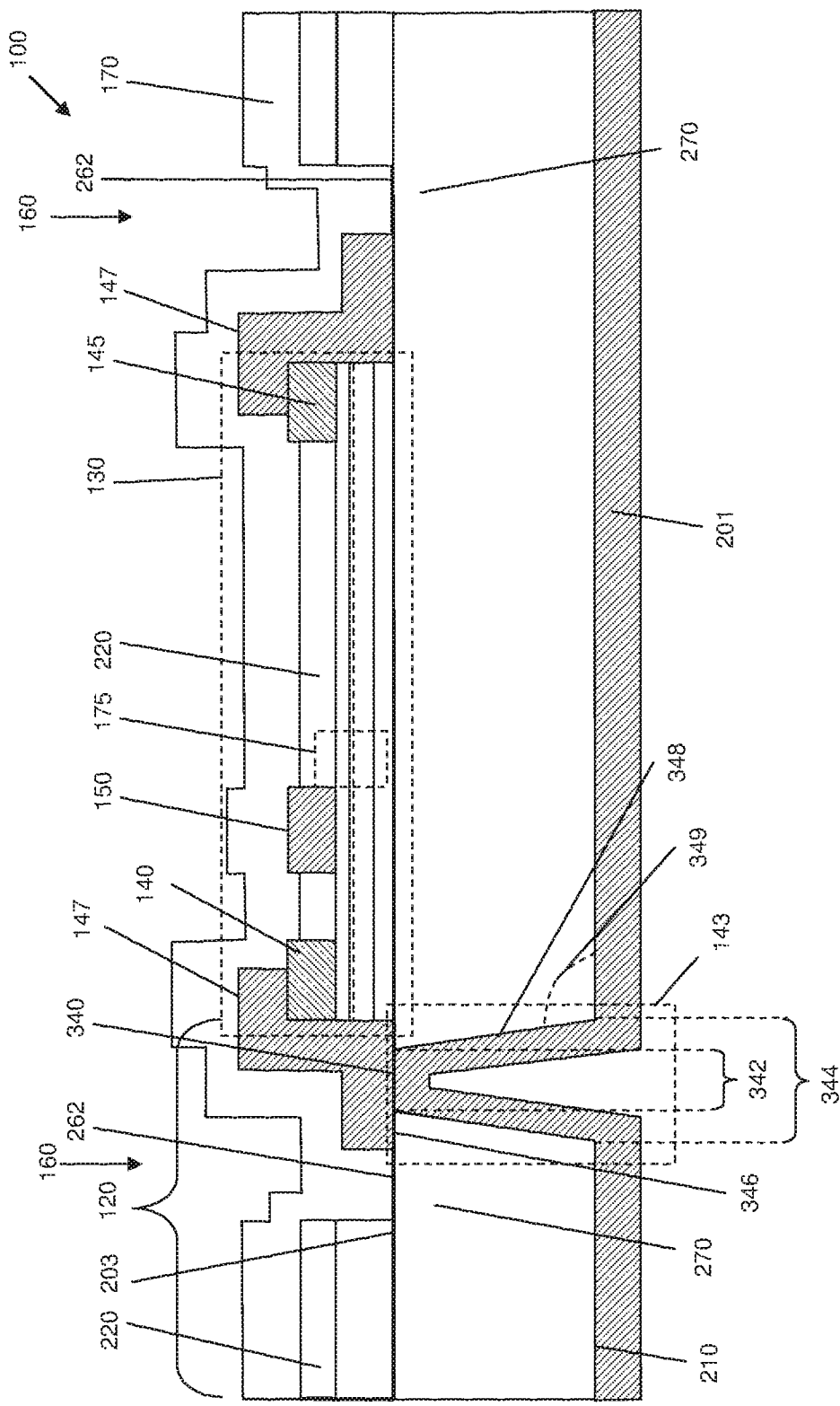
FIG. 3 is a cross sectional view of the GaN transistor of FIG. 1 along line 3-3, in accordance with an embodiment.

FIG. 3 depicts the example embodiment of GaN transistor 100, described in FIGS. 1 and 2 along cut-line 3-3 of FIG. 1 showing further details of the structure. According to an embodiment, interconnect metal 147 contacts source electrode 140 and contacts recessed surface 262 within substrate opening 160. In an embodiment, thermally conductive layer 170 may be formed over interconnect metal 147. As depicted in FIGS. 1 and 3, interconnect metal 147 does not completely cover the recessed surfaces 262 defining the bottoms of substrate openings 160 ensure that sufficient thermal interface areas are defined between thermally conductive layer 170 and the thermal reservoirs 270 that are accessible through substrate openings 160. In an embodiment, through wafer via 143 extends from lower surface 210 of host substrate 202 to recessed surface 262 defining the bottom of substrate opening 160 within semiconductor wafer 101. Through wafer via 143 may have an upper diameter 342 in the plane of recessed surface 262 of about 5 microns to about 80 microns and a lower diameter 344 in the plane of bottom surface 210 of about 10 microns to about 120 microns, although other diameters may be used.

The conductive material within through wafer via 143 may be formed from the same metal layer as back-metal layer 201, in an embodiment. Accordingly, back-metal layer 201 contacts interconnect metal 147 at a lower surface 346 of interconnect metal 147 and forms a continuous, conformal layer over sidewall 348 of through wafer via 143. Sidewall 348 may be sloped at a sidewall angle 349 greater than 90 degrees to lower surface 210 of host substrate 202, although sidewall angle 349 may be substantially 90 degrees in another embodiment. In an embodiment, recessed surface 262 defining the bottom of substrate opening 160 may be substantially co-planar with upper surface 203 of host substrate 202, as discussed previously. In other embodiments, recessed surface 262 may be located within a plane between upper surface 203 and lower surface 210 of host substrate 202. In these embodiments, through wafer via 143 may be located in regions that intersect substrate openings 160. In addition, in other embodiments, through wafer vias 143 may be located in regions of the semiconductor substrate 101 other than regions that intersect substrate openings 160.

Figure 17:
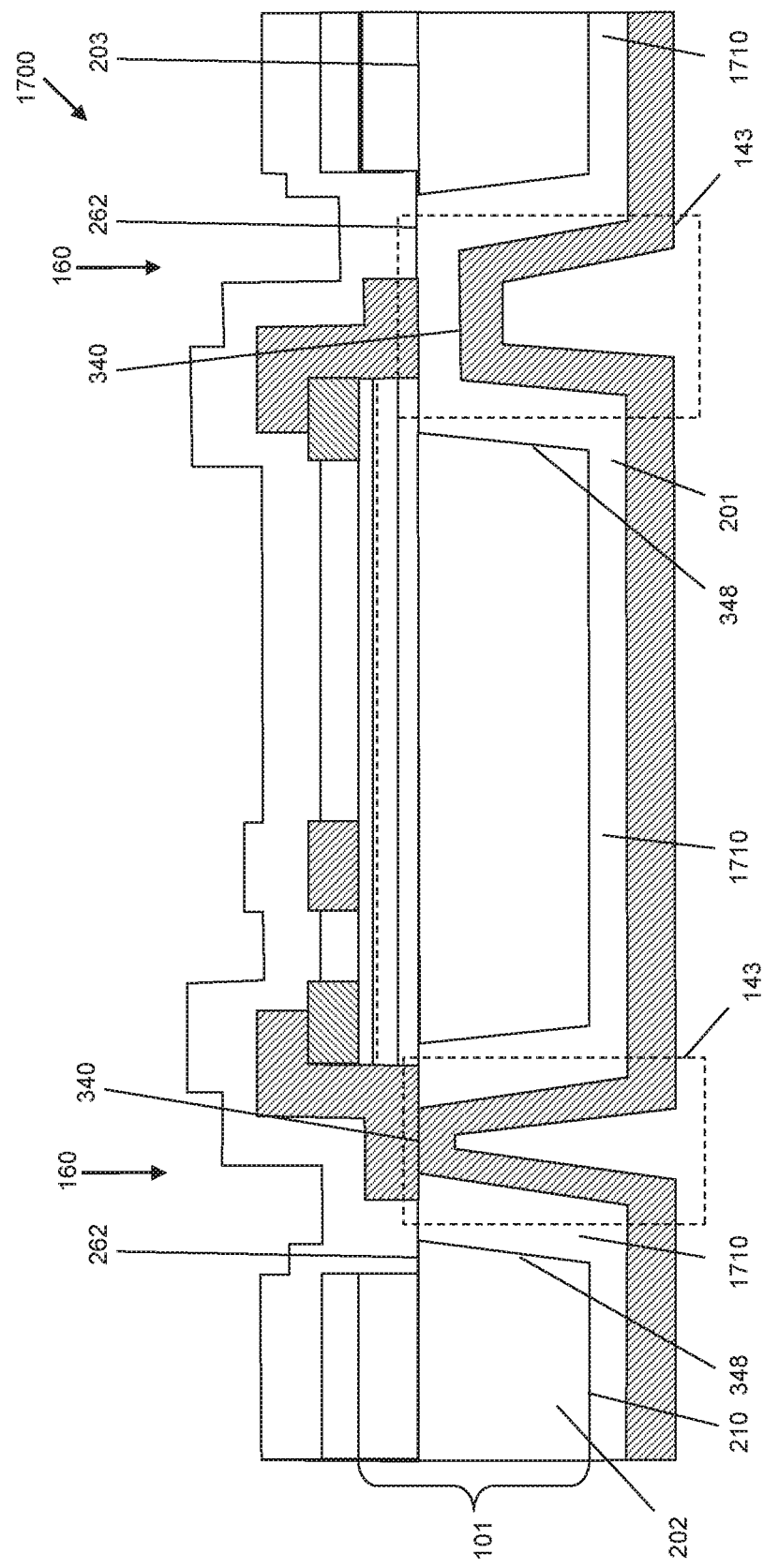
FIG. 17 is a cross sectional view of an alternate embodiment of a GaN transistor in accordance with an embodiment.

FIG. 17 shows other embodiments of GaN device 100 of FIG. 1. Without departing from the scope of the inventive subject matter, in other embodiments 1700, one or more additional high thermal conductivity backside layer(s) 1710 other than back-metal layer 201 may be used to contact the sidewalls 348 and the top 340 of through wafer vias 143, to provide additional thermal coupling and reduced thermal resistance between thermally conductive layer 170 and the thermal reservoir created by semiconductor substrate 101 and other surrounding structures in the region of through wafer via 143. In an embodiment, these additional high thermal conductivity backside layer(s) 1710 may be formed under back-metal layer 201 and in contact with through wafer via 143 in contact with sidewalls 348 and top 340. The materials used to form the high thermal conductivity backside layer(s) 1710 may include diamond, graphite, diamond-like materials, SiC, BN, Au, Cu, Al or other suitable materials(s). In such an embodiment, the high thermal conductivity materials 1710 coating the sidewall 348 and extending to the top 340 of through wafer vias 143 contact thermally conductive layer 170. Accordingly, thermally conductive layer 170 may contact high thermal conductivity materials in the wafer vias 143 to provide heat transfer from thermally conductive layer 170 to the back-metal layer 201. In these further embodiments where high thermal conductivity layers 1710 other than back-metal layer 201 may be used to contact the sidewalls 348 and the top 340 of through wafer vias 143, recessed surface 262 may be located within a plane between upper surface 203 and lower surface 210 of host substrate 202. Analogous to the embodiments discussed above, through wafer via 143 may be located in regions that intersect substrate openings 160. In addition, in other embodiments, through wafer vias 143 may be located in regions of the semiconductor substrate 101 other than regions that intersect substrate openings 160.

Figure 4:
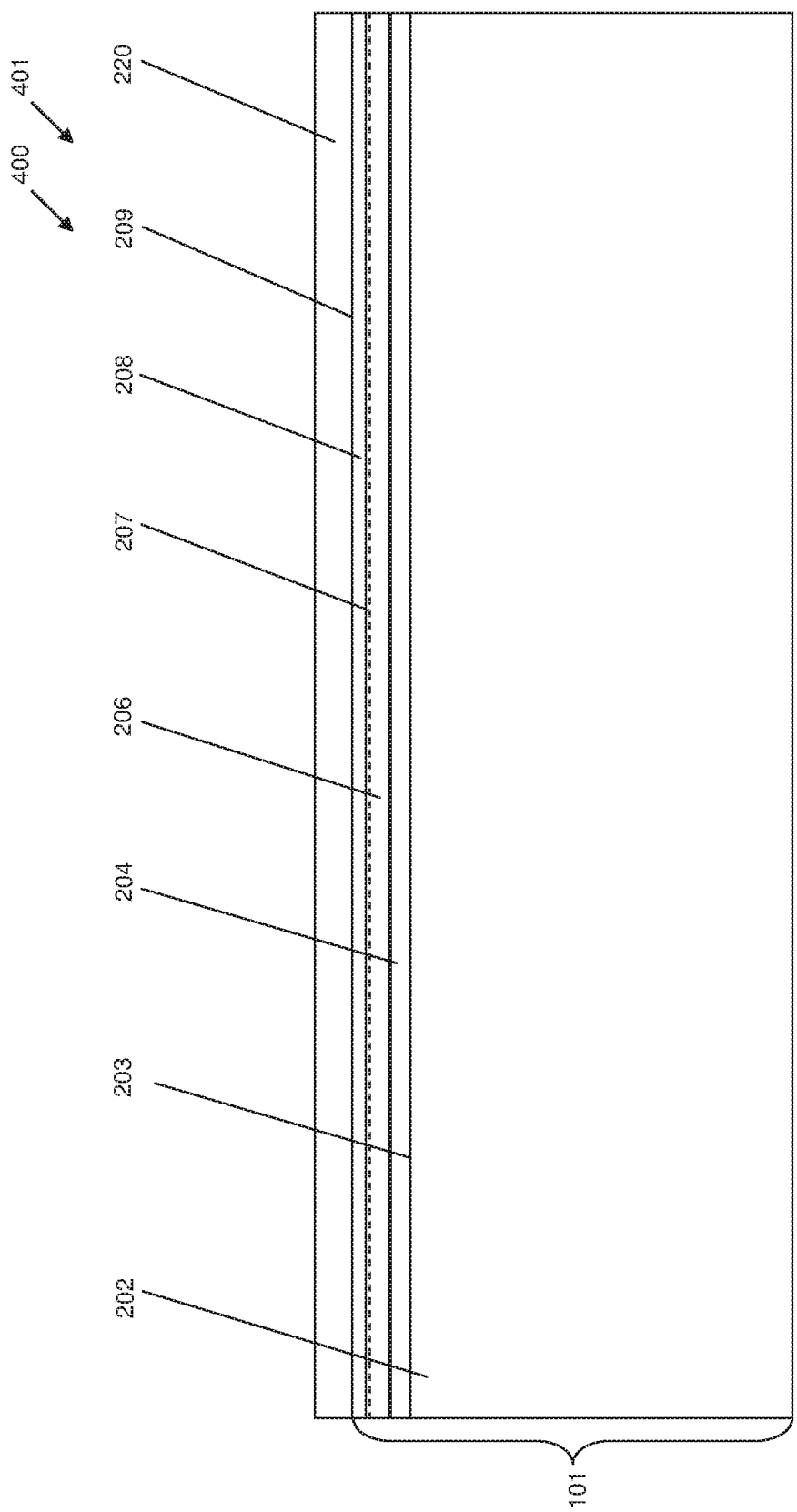
FIGS. 4-15 are cross sectional views of the GaN transistor device of FIG. 1 at various stages of fabrication.

Solder or other suitable materials or compounds (not shown) may be used to bond and thermally couple back-metal layer 201 in FIGS. 3 and 4 to a package or flange. In an embodiment, Gold-Tin (Au—Sn) eutectic may be used to bond back-metal layer 201 to a package or flange. In other embodiments, sintered silver (Ag) may be used to bond back-metal layer 201 to the package or flange. In still other embodiments, epoxy impregnated with Ag, diamond, or SiC particles may be used to bond back-metal layer 201 to the package or flange. In whichever embodiment, the back-metal layer 201 bonded to a package or flange also functions as a thermal reservoir for receiving and dissipating heat generated in heat generating region 175.

FIGS. 4-15 display simplified cross sectional views of a series of fabrication steps 400-1500 for forming GaN transistor 100 of FIG. 1, according to an embodiment. Referring first to FIG. 4, a step 400 of the method includes forming a semiconductor substrate 101 and then depositing first dielectric layer 220 over upper surface 209 of semiconductor substrate 101, according to an embodiment. In an embodiment, forming semiconductor substrate 101 includes providing host substrate 202 and depositing buffer layer 204, channel layer 206, barrier layer 208, and a cap layer (not shown) over and on top of host substrate 202 to form semiconductor substrate 101. The host substrate 202 may include SiC, sapphire, Si, GaN, AlN, diamond, poly-SiC, Si on insulator, GaAs, InP, or other suitable materials. According to an embodiment, buffer layer 204 may be deposited on or over an upper surface 203 of host substrate 202. Buffer layer 204 may include one of GaN, AlGaN, InGaN, a combination of these, or other suitable materials. According to an embodiment, channel layer 206 may be deposited on or over an upper surface of buffer layer 204. Channel layer 206 may include one of GaN, AlGaN, InGaN, a combination of these, or other suitable materials. According to an embodiment, barrier layer 208 may be deposited on or over channel layer 206. Barrier layer 208 may include one of AlGaN, InAlN, a combination of these or other suitable materials. According to an embodiment, a cap layer (not shown) may be deposited on or over the barrier layer 208. The cap layer may include GaN or other suitable materials. Each of buffer layer 204, channel layer 206, barrier layer 208, and the cap layer may be grown over an upper surface 203 of host substrate 202 using one of metal-organo chemical vapor deposition (MOCVD), molecular beam epitaxy (MBE), hydride-vapor phase epitaxy (HVPE) or a combination of these techniques, though other suitable techniques may be used.

According to an embodiment, the method further includes depositing a first dielectric layer 220 over upper surface 209 of semiconductor substrate 101. In some embodiments, first dielectric layer 220 may include thermally conductive material such as diamond, poly-diamond, AlN, BN, SiC, or other high thermal conductivity substantially insulating or semi insulating materials with a thermal conductivity greater than about 200 W/m-K. In other embodiments, first dielectric layer 220 may include one of silicon nitride, $SiO_2$, $HfO_2$, a combination of these or other insulating materials with thermal conductivities less than about 200 W/m-K. In still other embodiments, first dielectric layer 220 may include a combination of layers, some with thermal conductivity greater than 200 W/m-K and others with thermal conductivity less than 200 W/m-K. The total thickness of the layers used to form first dielectric layer 220 may be between about 100 and about 10,000 angstroms in thickness, although other thickness values may be used. In an embodiment, first dielectric layer 220 may be formed by depositing $Al_2O_3$ over and in contact with semiconductor substrate 101 and then depositing SiN over the $Al_2O_3$ layer. In another embodiment, first dielectric layer 220 may be formed by depositing $Al_2O_3$ or SiN or a combination of these over and in contact with semiconductor substrate 101 and then depositing diamond, AlN, or another suitable substantially insulating thermal conductor over the $Al_2O_3$ layer. First dielectric layer 220 may be deposited using low pressure chemical vapor deposition (LPCVD), plasma-enhanced chemical vapor deposition (PECVD), sputtering, physical vapor deposition (PVD), atomic layer deposition (ALD), catalytic chemical vapor deposition (Cat-CVD), hot-wire chemical vapor deposition (HWCVD), electron-cyclotron resonance (ECR) CVD, inductively coupled plasma (ICP), CVD, a combination of these or other suitable dielectric deposition technique(s). Structure 401 results.

Figure 5:
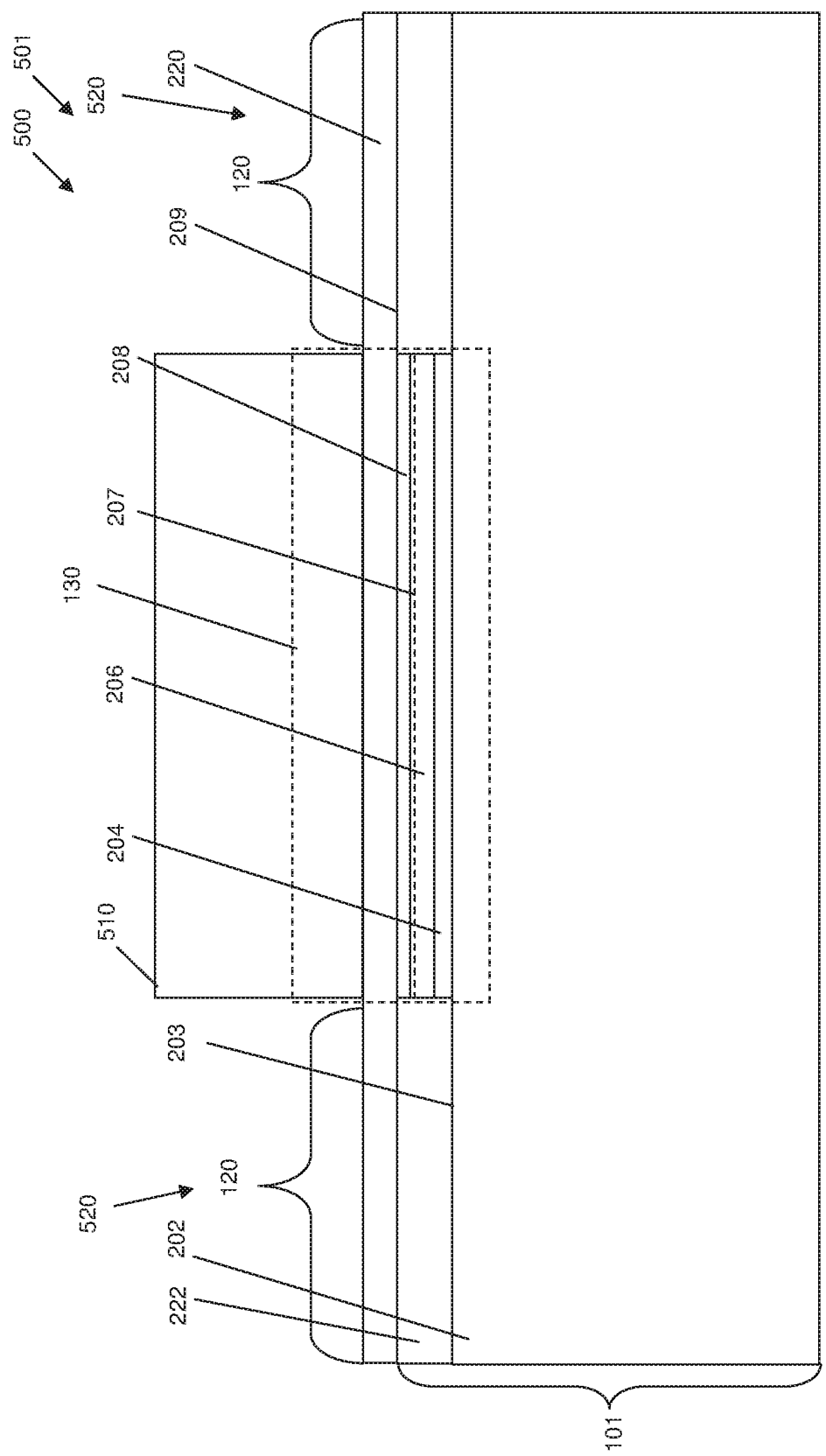

Referring now to FIG. 5 and step 500, the method of fabricating GaN transistor 100 further includes dispensing resist layer 510 over structure 401 of FIG. 4, patterning resist layer 510, and then implanting a species into first dielectric layer 220 and into semiconductor substrate 101 though openings 520 created in resist layer 510 to create isolation regions 120 and active area 130. According to an embodiment, resist layer 510 may include one or more layers of photo-resist with a thickness that ranges from about 0.2 microns to about 10 microns, although electron beam resist or other suitable patterning materials of other thicknesses also may be used. Patterning resist layer 510 may include applying a mask over resist layer 510, exposing unmasked portions of resist layer 510 to an appropriate dose of photon or electron beam irradiation, and then developing resist layer 510 with an appropriate developer.

According to an embodiment, isolation regions 120 may be formed by implanting an ion species at an energy sufficient to drive the species through dielectric layer 220 and into barrier layer 208, channel layer 206, and buffer layer 204, thus damaging the crystal lattice for these layers, disrupting channel 207 within the isolation regions 120, and creating high resistivity semiconductor regions 222 within semiconductor substrate 101. According to an embodiment, one of N, boron (B), helium (He), hydrogen (H), or a combination of these or one or a combination of other suitable ion species may be implanted through openings 520 in resist layer 510 to create high resistivity semiconductor regions 222 below upper surface 203 of semiconductor substrate 101. The depth of high resistivity semiconductor regions 222 depends on the thicknesses of first dielectric layer 220, barrier layer 208, channel layer 206, and buffer layer 204 as well as the accelerating potential and mass of the ion species implanted into semiconductor substrate 101. Both the presence of the implanted species as well as the damage caused within the crystal lattice within semiconductor substrate 101 render the affected high resistivity regions 222 semi-insulating, thus forming isolation regions 120. Structure 501 results. The remaining areas protected by resist layer 510 that are not exposed to ion implantation, etching, or otherwise rendered high resistivity or removed are included in the active area 130. After formation of the isolation regions 120, resist layer 510 is removed from structure 501 using appropriate solvents (not shown).

In other embodiments (not shown), isolation regions 120 are formed by removing (e.g., etching) dielectric layer 220, barrier layer 208, channel layer 206, and buffer layer 204 within the isolation regions 120 to remove channel 207 within the isolation regions 120. In these embodiments using etched isolation, the etching of semiconductor layers that overlie host substrate 202 including barrier layer 108, channel layer 106, and buffer layer 104 may terminate within one of these layers. Alternatively, the etching may terminate on upper surface 203 of host substrate 202 or may extend into host substrate 202 below upper surface 203. In some embodiments, etching may be used in conjunction with ion implantation to create isolation regions 120. In further embodiments, the upper etched surface that results from isolation via etching may serve as recessed surface 262 referred to in FIG. 2.

Figure 6:
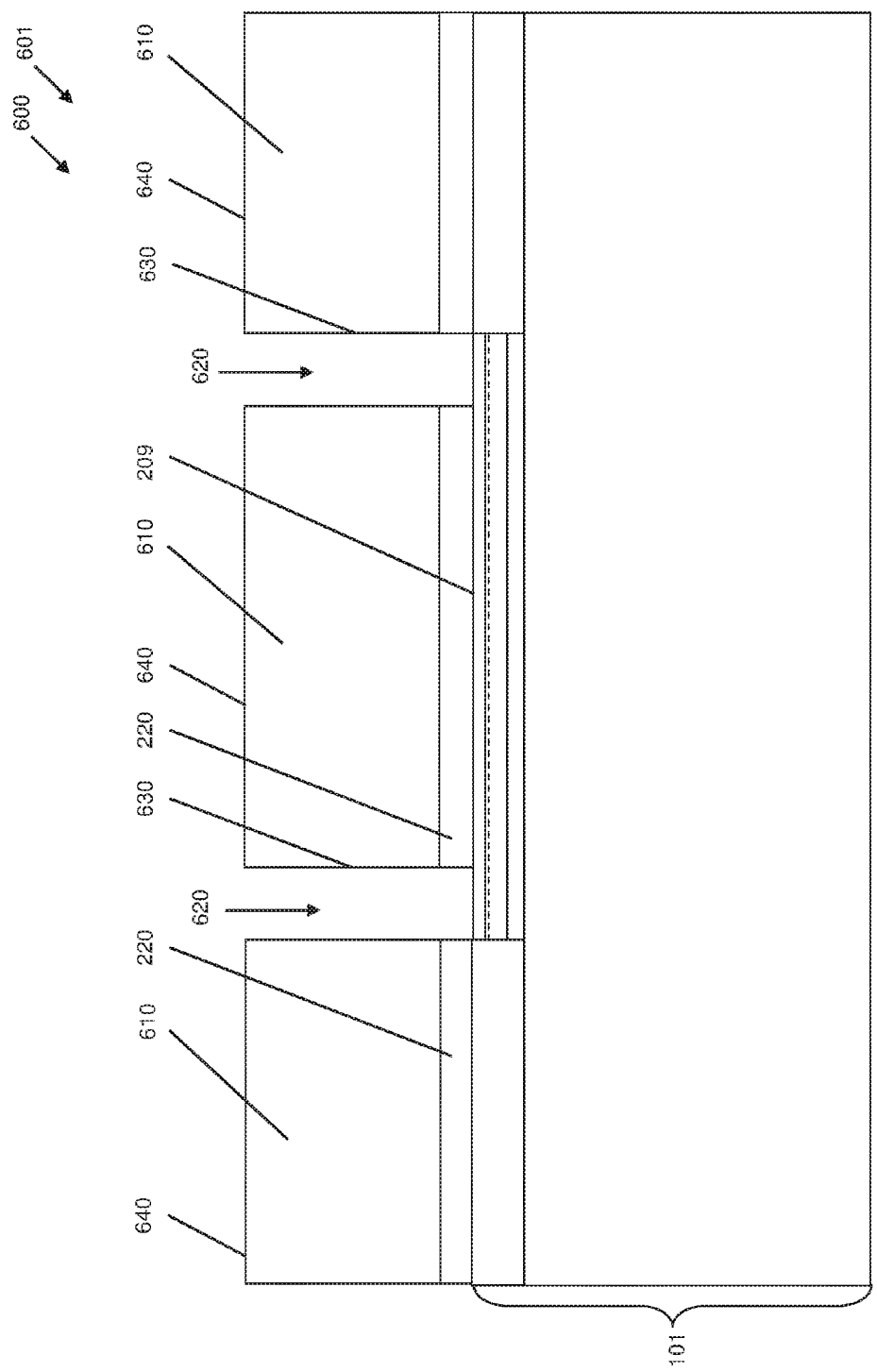
Figure 7:
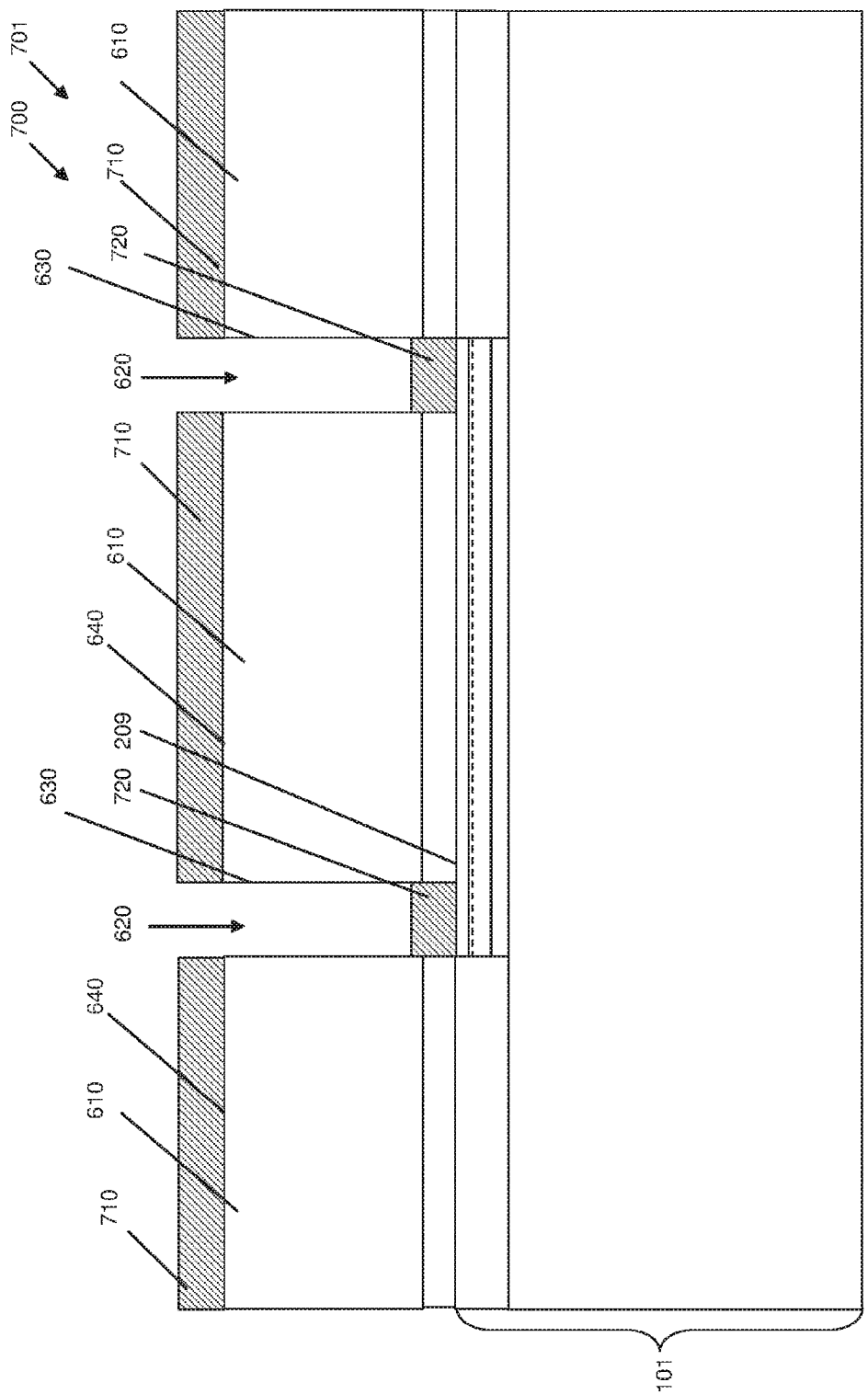
Figure 8:
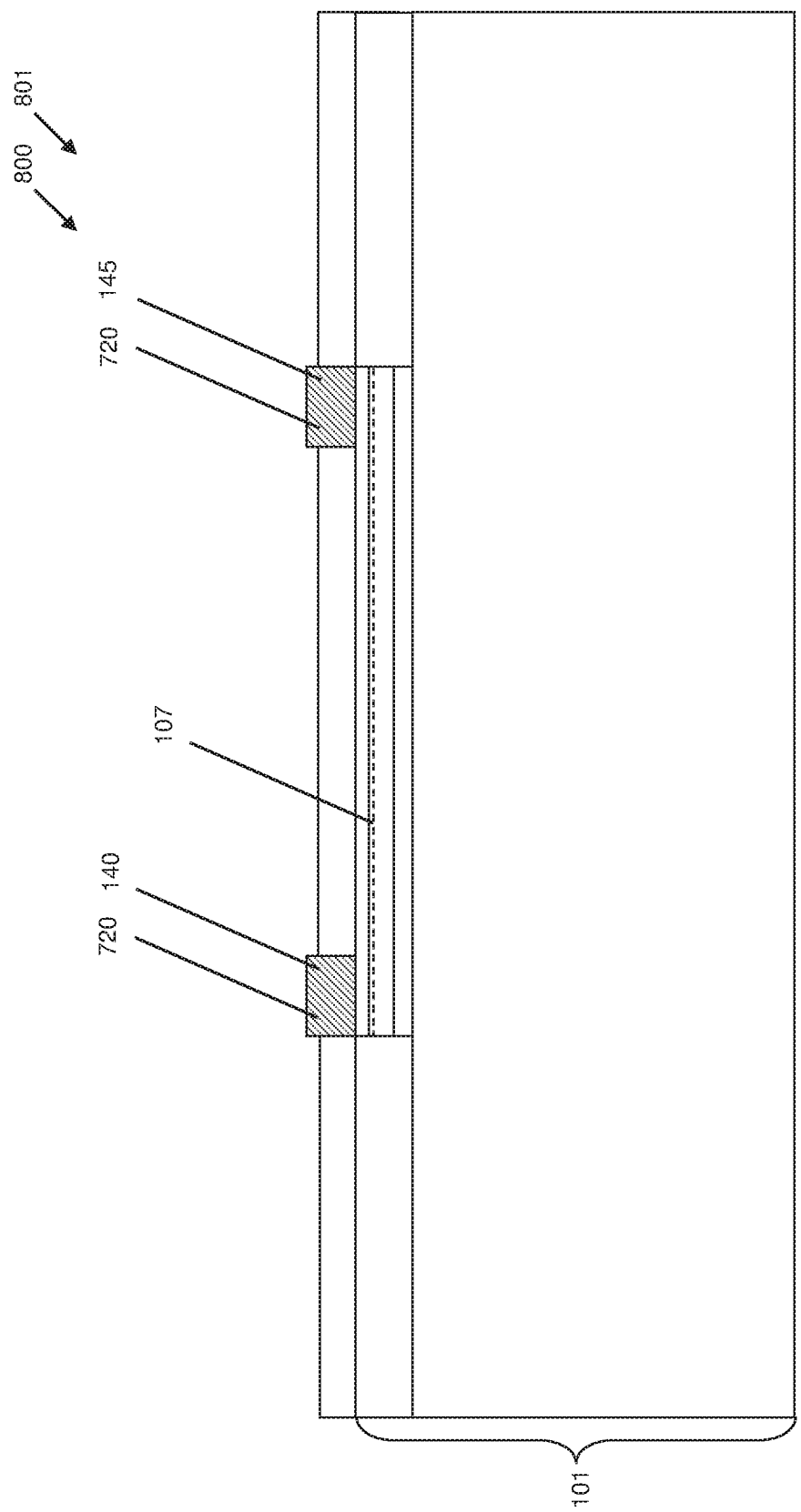

Referring now to FIGS. 6-8 and steps 600-800, the method of fabricating GaN transistor 100 further includes forming source electrode 140 and drain electrode 145 of FIG. 2. FIG. 6 and step 600 depicts and describes creating openings 620 for forming source electrode 140 and drain electrode 145 of FIGS. 1-3 according to an embodiment. In an embodiment, opening 620 in resist layer 610 is created by dispensing resist layer 610 over semiconductor substrate, and patterning resist layer 610. According to an embodiment, resist layer 610 may include one or more layers of photo-resist with a thickness that ranges from about 0.5 microns to about 10 microns, although electron beam resist or other suitable patterning materials or of other thicknesses may be used. Patterning resist layer 610 to create opening 620 may include applying a mask over resist layer 610, exposing unmasked portions of resist layer 610 with an appropriate dose or doses of photon and/or electron beam irradiation and then developing the resist layer 610 with an appropriate developer(s). In an embodiment, the openings 620 may be aligned to isolation regions 120 using alignment marks or other appropriate means created using a separate alignment mark level (not shown) also aligned to isolation regions 120. In other embodiments, step 600 may be a first step in the method, requiring no alignment to a prior process layer. In an embodiment, a "lift-off profile" is used to create a profile for the sidewalls 630 within the opening 620 such that the opening 620 is slightly larger at the bottom of the opening 620 near the upper surface 209 of semiconductor substrate 101 than at the upper surface 640 of resist layer 610. The lift-off profile ensures that subsequent deposition of metal will not create metal connection bridges between metal deposited over the upper surface 640 of resist layer 610 and within opening 620 over and in contact with semiconductor substrate 101. A plasma de-scum process may be used to remove residual traces of undeveloped resist material (not shown) from the exposed upper surface of the first dielectric 220 within opening 620.

In an embodiment, an etch process is used to remove portions of dielectric layer 220 (within openings 620) thus exposing upper surface 209 of semiconductor substrate 101 within openings 620. In an embodiment, the first dielectric layer 220 is removed using an appropriate dry or wet etch technique or a combination of both. In an embodiment, dry etching of first dielectric layer 220 to expose a portion of the upper surface 209 of semiconductor substrate 101 may include reactive ion etching (RIE), inductively coupled plasma (ICP) etching, electron-cyclotron resonance (ECR) etching or a combination of these techniques, though other suitable techniques may be used. Suitable fluorine (F)-based dry etch chemistries such as sulphur hexafluoride ($SF_6$), carbon hexafluoride ($C_2F_6$), carbon tetrafluoride ($CF_4$), or other suitable dry etch chemistries may be used. The dry etch chemistries may be supplemented with argon (Ar) or oxygen ($O_2$) or a combination of these or other suitable gases to prevent polymer formation within the openings 620 when etching the first dielectric layer 220. Wet etching of the first dielectric layer 220 may be accomplished using hydrofluoric acid (HF), dilute HF, buffered oxide etch (BOE), hot phosphoric acid ($H_3PO_4$), or other suitable wet chemistry technique. In an embodiment, when first dielectric layer 220 includes a SiN layer deposited over an $Al_2O_3$ layer, first dielectric layer 220 may be etched using an F-based dry etch such as RIE, ICP, or ECR to remove the SiN layer followed by a BOE wet etch to remove the $Al_2O_3$ layer, exposing portions of upper surface 209 of semiconductor substrate 101 underlying openings 620. In other embodiments, when a CVD diamond layer or other insulating thermal conductor is deposited directly over and in contact with semiconductor substrate 101, or alternatively, over a lower thermal conductivity insulating layer such as one of $Al_2O_3$, SiN, or a combination of these or other suitable layer(s), an $O_2$ plasma may be used to etch the CVD diamond layer. Suitable wet-etch or dry etch chemistries may be used to remove the underlying (e.g. $Al_2O_3$ or SiN) layer(s). Structure 601 results.

FIG. 7 depicts depositing an ohmic metal layer 710 to form contacts 720, in step 700 according to an embodiment. In an embodiment, the ohmic metal layer 710 is deposited over and in contact with upper surface 640 of resist layer 610 and into the openings 620 in contact with the exposed portions of the upper surface 209 of the semiconductor substrate 101. In an embodiment, ohmic metal layer 710 may include a multi-layer stack of metals, including metal layers, from bottom to top, of titanium (Ti), Al, molybdenum (Mo), and Au, although other suitable materials may be used. In an embodiment, the thickness of the Ti layer may range from about 50 to about 500 angstroms, the thicknesses of the Al layer may range from about 500 to about 5000 angstroms, the thicknesses of the Mo layer may range from about 500 to about 1000 angstroms, and the thickness of the Au layer may range from about 500 to about 1000 angstroms, although other ranges of thicknesses may be used for each layer. In some embodiments, one or more of the Ti, Al, Mo, or Au layers may be omitted or substituted for other suitable materials. In an embodiment, the multi-layer stack of metals may be deposited by evaporation, sputtering, PVD, ALD, or other suitable deposition techniques. In an embodiment, the excess regions of ohmic metal layer 710 not within the openings 620 may be removed using a "lift-off" technique by immersing the wafer in solvents that penetrate resist layer 610 through sidewalls 630 (and/or other sidewalls, not shown) in the resist layer 610. This causes the ohmic metal layer 710 that was in contact with the upper surface 640 of resist layer 610 but not directly in contact with semiconductor substrate 101 to wash away. Contacts 720 (or the portions of ohmic metal layer 710 that are directly in contact with semiconductor substrate 101) remain on the upper surface of the semiconductor substrate 101. In other embodiments, other techniques known in the art such as etching may be used to pattern contacts 720. Structure 701 results.

As depicted in FIG. 8 and step 800, the method further includes annealing contacts 720 to form source electrode 140 and drain electrode 145, according to an embodiment. In an embodiment, annealing contacts 720 includes loading structure 701 of FIG. 7 (after removal of resist layer 610) into a rapid thermal annealing (RTA) system or thermal furnace and raising the temperature of the semiconductor substrate 101 and contacts 720 to an appropriate temperature in the presence of a suitable ambient gas or mixture. In an embodiment, an RTA system may be used to anneal contacts 720 to form source electrode 140 and drain electrode 145 at a temperature between about 500 and about 900 degrees Celsius (° C.) for 15 to 120 seconds, though other suitable temperatures and times may be used. In an embodiment, the RTA system may use one of nitrogen ($N_2$), oxygen ($O_2$), or forming gas ambient, though a combination of these or other suitable ambient gasses may be used. In an embodiment, the time, temperature, and ambient gasses are optimized to create an ohmic contact between source electrode 140 and channel 107, and between drain electrode 145 and channel 107. The ohmic contact resistance between source electrode 140 or drain electrode 145 and channel 107 may between about 0.05 and about 1.00 ohm-mm though other contact resistance values may be used. Structure 801 results.

Referring now to FIG. 9 and step 900, the method of fabricating GaN transistor device 100 further includes forming gate electrode 150 according to an embodiment. In an embodiment, forming gate electrode 150 includes applying and patterning resist layer(s) to structure 801 of FIG. 8, and etching first dielectric layer 220 analogous to steps described in FIG. 6 and step 600. The embodiment further includes depositing gate metal and lifting-off gate metal analogous to the steps described in FIG. 7 and step 700.

In an embodiment, photo resist or e-beam resist is patterned to create an opening in the resist in a manner analogous to the description given for FIG. 6 and step 600. Using the opening created in the resist layer, first dielectric layer 220 may be etched to form a gate contact opening, thus exposing a portion of the upper surface 209 of semiconductor substrate 101, according to an embodiment. In an embodiment, one or more layers of gate metal may then be deposited over the opening in the resist to form gate electrode 150 over an upper surface 209 of semiconductor substrate 101. Depositing gate metal to form gate electrode 150 may include depositing a multi-layer stack that includes one or more metal layers and/or other suitable materials. A first layer within the multi-stack used to form gate electrode 150 may include Ti, Ni, Pt, Cu, Pd, Cr, W, Ir, $Ni_xSi_y$, poly-silicon or other suitable materials. The first layer may be between about 30 and about 2,000 angstroms in thickness, although other thickness values may be used. One or more layers that act as conductive layers may be deposited over the first layer to form gate electrode 150, according to an embodiment. The conductive layer(s) may include Au, Ag, Al, Cu, Ti or other substantially conductive materials. The conductive layer(s) may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr, W, Ir, $Ni_xSi_y$ or other substantially refractive materials that act as a barrier between the portion of the first layer that contacts semiconductor substrate 101 and the conductive layer(s). The barrier metal layer(s) may be between about 50 and about 10,000 angstroms in thickness, although other thickness values may be used. In an embodiment, the various layers used to form gate electrode 150 may be deposited by evaporation, sputtering, PVD, ALD, or other suitable deposition technique(s).

In an embodiment, annealing may be used to stabilize gate electrode 150 analogous to annealing of the source contact 140 and drain contact 145 in FIG. 8 and step 800. Annealing gate electrode 150 includes placing the semiconductor substrate 101 with gate electrode 150 into a RTA or thermal furnace, raising the temperature of semiconductor substrate 101 and gate electrode 150 to an appropriate temperature in the presence of a suitable ambient gas or mixture. In an embodiment, an RTA system may be used to anneal gate electrode 150 at a temperature between about 200° C. and about 600° C. for 15 seconds to about 2 hours, although other suitable temperatures and times may be used. In an embodiment, the RTA system may use one of $N_2$, $O_2$, air, or forming gas ambient, though a combination of these or other suitable ambient(s) may be used. In an embodiment, the time, temperature, and ambient gasses are optimized to stabilize the gate electrode 150. Structure 901 results.

It should be appreciated that other methods may be used to form gate electrode 150 without departing from the scope of the inventive subject matter. In methods for fabricating these other embodiments (not shown), gate electrode 150 may be formed by patterning a first resist layer to form an opening, etching first dielectric 220 to create an opening exposing upper surface 209 of semiconductor substrate 101, and then removing the first resist layer. In this embodiment, forming gate electrode 150 then includes patterning an opening in a second resist layer aligned over the opening created in first dielectric 220 to expose upper surface 209 of semiconductor substrate 101. The opening in the second resist layer may be smaller or larger than the opening in first dielectric layer 220. In other embodiments, gate metal may be disposed over a gate dielectric such as $SiO_2$, $HfO_2$, $Al_2O_3$, or similar materials. The gate dielectric may be deposited over and above upper surface 209 of semiconductor substrate 101, according to an embodiment. In still other embodiments, gate electrode 150 may be formed using gate metal that is deposited over semiconductor substrate 101 and is then defined by patterning photo resist, and then etching the gate metal. In whichever embodiment or method is selected to form gate electrode 150, gate metal may then be deposited using the methods described in connection with the formation of gate electrode 150 shown in FIG. 9.

Figure 10:
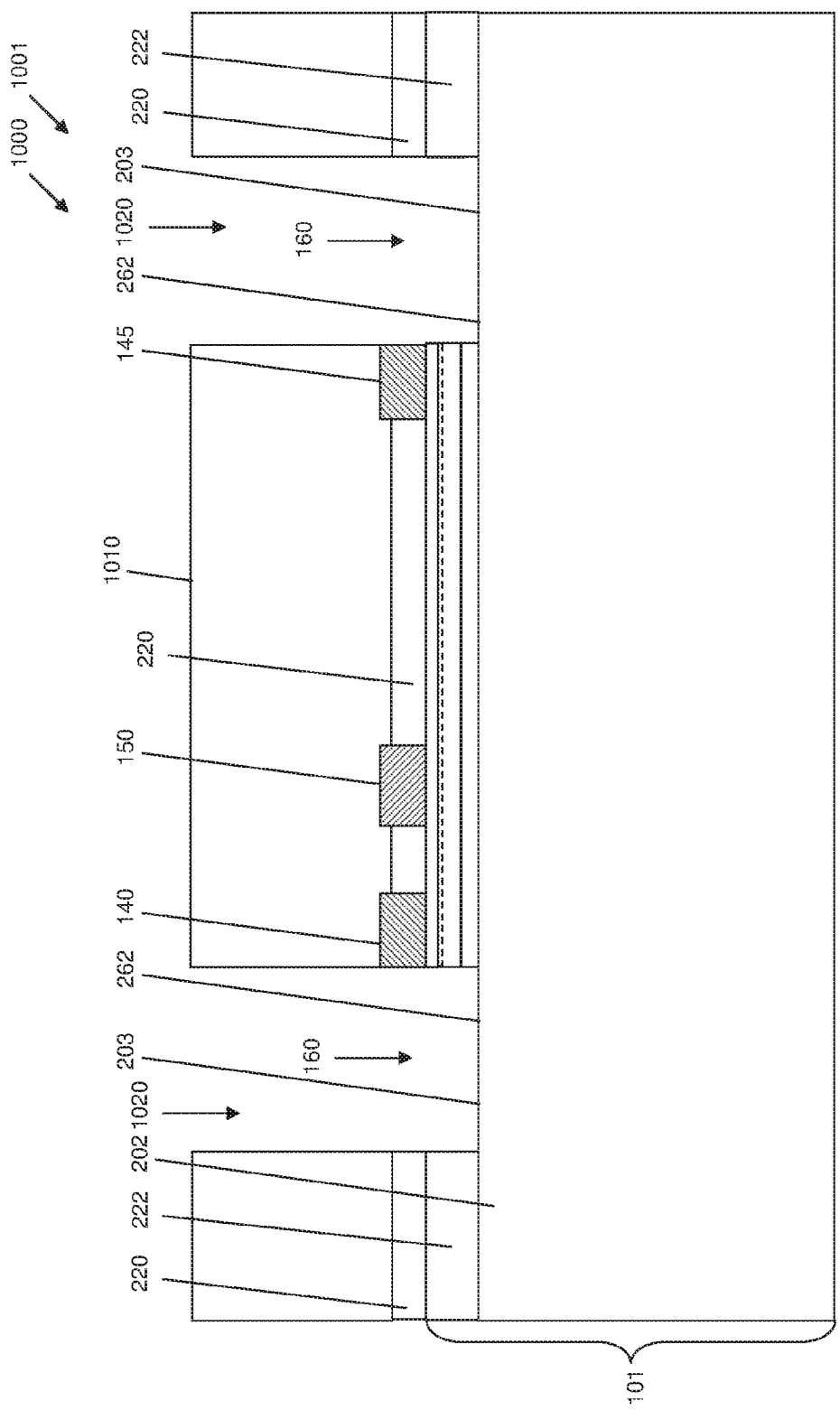

Referring now to FIG. 10 and step 1000, the method of fabricating GaN transistor 100 further includes etching substrate openings 160 into substrate 101 proximate source electrode 140 and drain electrode 145, according to an embodiment.

In an embodiment, a resist layer 1010 is applied over structure 901 of FIG. 9. The thickness of resist layer 1010 depends on the depth of substrate opening 160. According to an embodiment, resist layer 1010 may include one or more layers of photo-resist with a thickness that ranges from about 0.5 microns to about 50 microns. Patterning resist layer 1010 to create openings 1020 in resist layer 1010 may include applying a mask over resist layer 1010, exposing unmasked portions of resist layer 1010 with an appropriate dose or doses of photon irradiation and then developing the resist layer 1010 with an appropriate developer(s). In some embodiments, resist layer 1010 may be used to etch a hard-mask layer (not shown) that is then used for etching substrate openings 160 into semiconductor substrate 101. The hard mask layer may include Ti, Al, Ni, Cr, or other suitable refractory metals. Whether a resist layer 1010 or hard mask is used, the openings 1020 may be aligned to alignment marks (not shown) formed using the same material as source electrode 140, drain electrode 145, gate electrode 150, though other layers may be used for alignment. In other embodiments, step 1000 may be a first step in the method, requiring no alignment to a prior process layer. A plasma de-scum process (not shown) may be used to remove residual traces of undeveloped resist material from the exposed upper surface of the first dielectric 220 within opening 1020.

In an embodiment, etching substrate openings 160 includes the steps of etching, through resist layer openings 1020, openings in first dielectric layer 220 using dry and/or wet etch techniques analogous to those described in connection with FIG. 6 and step 600, and then etching into semiconductor substrate 101 to create recessed surfaces 262 at the bottom of substrate openings 160.

In an embodiment, etching semiconductor substrate 101 may involve using etching to remove all or a portion of the semiconductor layers within high resistivity semiconductor region 222 to create recessed surface 262. In an embodiment, the etch may terminate on upper surface 203 of host substrate 202, creating recessed surfaces 262. In other embodiments, etching semiconductor substrate 101 may also involve etching into host substrate 202, below upper surface 203 to create recessed surfaces 262. In an embodiment, etching the high resistivity semiconductor region 222 is accomplished using an appropriate dry or wet etch technique or a combination of both. In an embodiment, dry etching is used to etch semiconductor substrate 101 to expose recessed surfaces 262 within semiconductor substrate 101. Techniques for dry etching semiconductor layer(s) that overlie host substrate 202 may include reactive ion etching (RIE), inductively coupled plasma (ICP) etching, electron-cyclotron resonance (ECR) etching or a combination of these techniques, though other suitable techniques may be used. In an embodiment, suitable chlorine (Cl)-based dry etch chemistries such as Cl, boron tri-chloride ($BCl_3$), or other suitable dry etch chemistries may be used to etch GaN layers within semiconductor substrate 101. The dry etch chemistries may be supplemented with argon (Ar) or oxygen ($O_2$) or a combination of these or other suitable gases to prevent polymer formation within the openings 1020 when etching semiconductor substrate 101. In an embodiment, dry etching of the GaN layers may be supplemented with one or more wet etches to remove residual regions of defects that may exist on the surface of host substrate 202. Suitable wet chemistries to etch GaN include hot KOH, molten KOH, and hot phosphoric acid ($H_3PO_4$), though other suitable chemistries may be used. In other embodiments, wet chemistries may be used to etch semiconductor substrate 101. Wet chemistries such as hot KOH may be used to etch GaN-based layers. Structure 1001 results.

In other embodiments (not shown), additional etching may be used to remove material from host substrate 202 after portions of semiconductor layers overlying host substrate 202 are removed from semiconductor substrate 101. In an embodiment, etching the host substrate 202 is accomplished using an appropriate dry or wet etch technique or a combination of both. In an embodiment, dry etching is used to etch host substrate 202 to expose a recessed surface 262 within host substrate 202 (i.e., a surface below surface 203 of host substrate 202). Techniques for dry etching host substrate 202 may include reactive ion etching (RIE), inductively coupled plasma (ICP) etching, electron-cyclotron resonance (ECR) etching or a combination of these techniques, though other suitable techniques may be used. The chemistries used in connection with these techniques depend on the composition of host substrate 202. For etching a Si-based host substrate 202, such as Si or SiC, suitable F-based chemistry such as $SF_6$, $C_2F_6$, $CF_4$, or other suitable dry etch chemistries may be used. The dry etch chemistries may be supplemented with argon (Ar) or oxygen ($O_2$) or a combination of these or other suitable gases to prevent polymer formation within the opening 1020 when etching host substrate 202. For host substrates that include GaN, suitable chlorine (Cl)-based dry etch chemistries such as Cl, boron tri-chloride ($BCl_3$), or other suitable dry etch chemistries may be used. The dry etch chemistries may be supplemented with argon (Ar) or oxygen ($O_2$) or a combination of these or other suitable gases to prevent polymer formation within the opening 1020 when etching host substrate 202. In an embodiment, one or more wet etches that remove residual regions of defects that may exist on surface of host substrate 202 may supplement dry etching of host substrate 202. Suitable wet chemistries to etch defects include hot KOH, molten KOH, and hot phosphoric acid ($H_3PO_4$), though other suitable chemistries may be used. In other embodiments, wet chemistries may be used to etch host substrate 202.

It should be appreciated that the ordering of the steps of forming substrate openings 160 is merely exemplary. In other embodiments, substrate openings 160 may be formed at other points in the process. For example, substrate openings 160 may be formed prior to depositing first dielectric 220 or after creating isolation regions 120.

Figure 11:
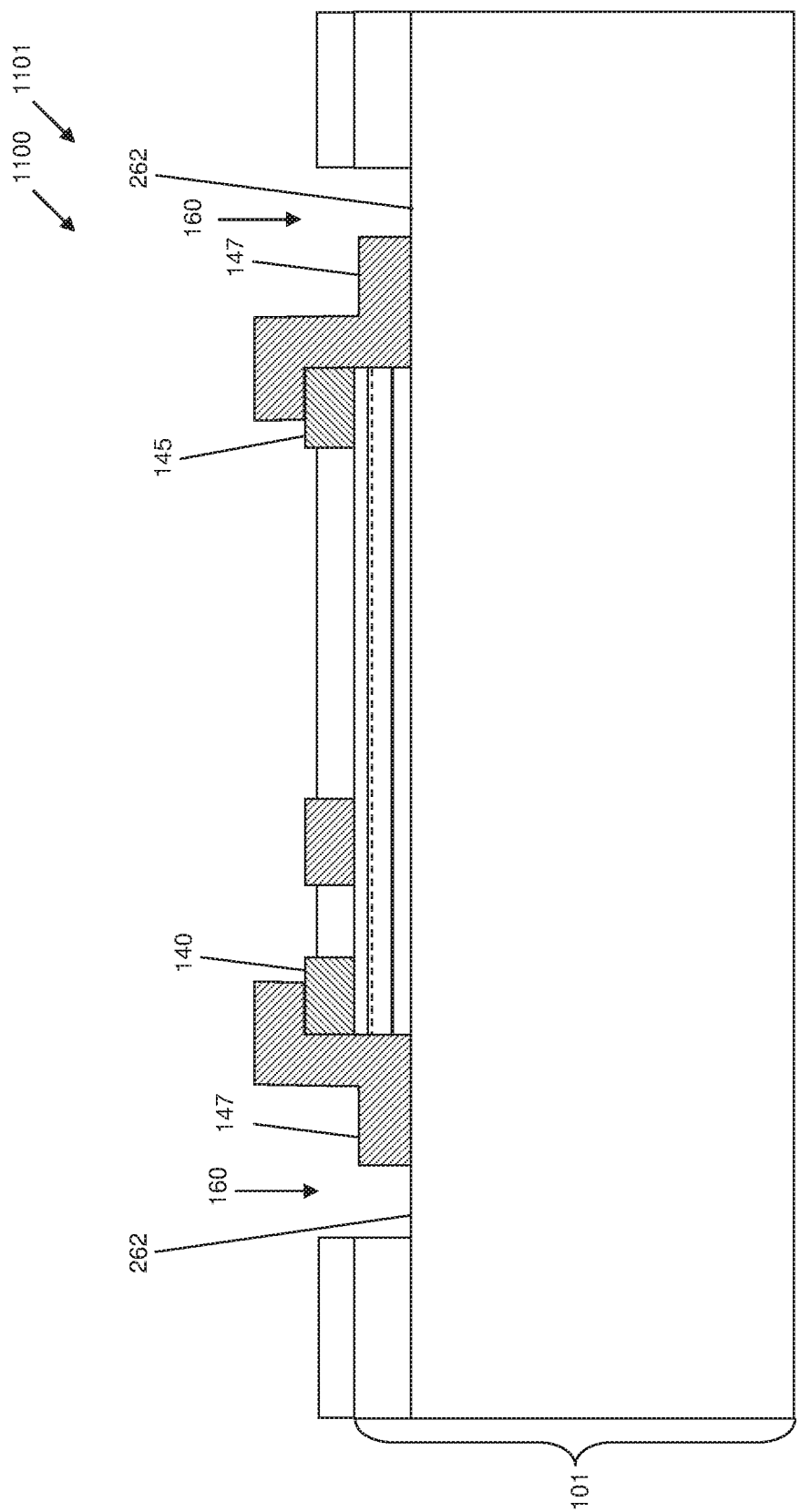

Referring now to FIG. 11 and step 1100, the method of fabricating GaN transistor 100 further includes depositing and patterning interconnect metal 147 over source electrode 140, drain electrode 145, and first dielectric 220 according to an embodiment. In an embodiment, patterning interconnect metal 147 may be accomplished by applying and patterning resist layers (not shown) over structure 1001 of FIG. 10 (after removal of resist 1010), depositing interconnect metal 147, and removing the resist layers and overlying interconnect metal 147 in a lift-off configuration, analogous to step 600 in FIG. 6. In an embodiment, interconnect metal 147 may be formed by metal layers and deposition techniques analogous to the descriptions of step 700 in FIG. 7 for forming contacts 720. In an embodiment, interconnect metal 147 is formed by depositing one or more adhesion and conductive metal layers into openings (not shown) patterned into the resist layers applied to the partially-formed device as described above. In an embodiment, the adhesion layer(s) may be deposited first, followed by deposition of the conductive layer(s). In an embodiment, the adhesion and conductive layers may be deposited in the same deposition step. The adhesion layer(s) may include one of Ti, Ni, Cr or other suitable adhesion layer material(s). The adhesion layer(s) may be between about 50 and about 2,000 angstroms in thickness, although other thickness values may be used. The conductive layer(s) may include Cu, Au, Al, or Ag, although other suitable materials may be used. The conductive layer(s) may be between about 200 and about 40,000 angstroms in thickness, although other thickness values may be used. The adhesion and conductive layers that form interconnect metal 147 are deposited over and in contact with source electrode 140 and drain electrode 145, according to an embodiment. In an embodiment, interconnect metal 147 also is deposited over and in contact with recessed surfaces 262 of substrate openings 160. In an embodiment, the adhesion layer(s) and conductive layer(s) may be formed by sputtering, evaporation, or electro-plating.

In an embodiment, after applying and patterning resist layers and depositing the interconnect metal 147, the resist layers and metals deposited over the resist layers and not included with the portions of interconnect metal 147 that contact electrodes 140, 145 and substrate 101 are removed using solvents analogous to those described in conjunction step 700 in FIG. 7. In other embodiments, interconnect metal 147 may be formed by depositing adhesion and conductive layers that are then patterned by suitable dry or wet chemical etching techniques. Structure 1101 results.

Figure 12:
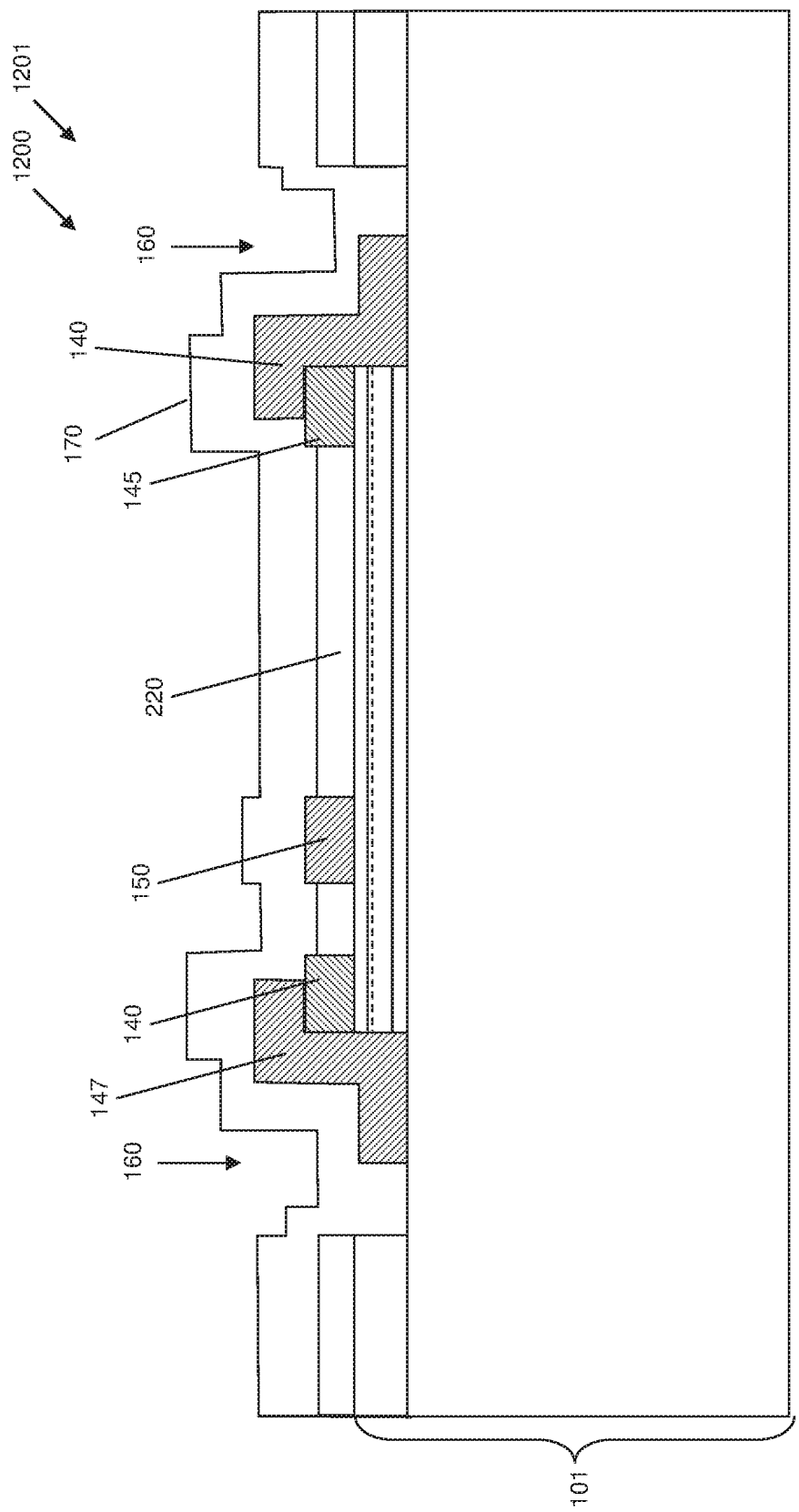

As depicted in FIG. 12 and step 1200 the method for fabricating GaN transistor 100 includes depositing thermally conductive layer 170 over substrate openings 160, interconnect metal 147, source electrode 140, drain electrode 145, gate electrode 150, first dielectric 220, and semiconductor substrate 101 according to an embodiment. Thermally conductive layer 170 may include diamond, graphite, diamond-like materials, SiC, BN, Au, Cu, Ag, Al, or other suitable materials(s). Thermally conductive layer 170 may have a total thickness of between about 500 and about 20,000 angstroms, although other thickness values may be used. Thermally conductive layer 170 may be formed using CVD, sputtering, or other suitable deposition technique. In an embodiment, the process for depositing thermally conductive layer 170 may include nucleating a thin film of defective material to establish bonding to the underlying layer(s), followed by depositing material with lower defectivity. In an embodiment, openings in thermally conductive layer 170 may be created by patterning thermally conductive layer 170 with photo resist or a hard mask and then etching thermally conductive layer 170 using appropriate plasma etch chemistries analogous to etching steps for corresponding materials as described in FIG. 6 and step 600 (not shown). Structure 1201 results.

Without departing from the scope of the inventive subject matter, additional process steps (not shown) may be employed to deposit additional metal layers for additional connections between gate electrode 150, interconnect metal 147 and other circuitry that may be electrically coupled to GaN transistor 100. In some embodiments, additional process steps for depositing and patterning one or more additional thermally conductive layers may also be employed analogous to step 1100, FIG. 11. In some embodiments, additional process steps for depositing and patterning one or more additional dielectric layers for moisture and chemical protection may also be employed. The additional dielectric layer(s) may include one of silicon nitride ($Si_3N_4$), silicon dioxide ($SiO_2$), aluminum oxide ($Al_2O_3$), a combination of these or other suitable insulating dielectric layer(s). The additional dielectric layer(s) may have a total thickness of between about 100 and about 20,000 angstroms, although other thickness values may be used. The additional dielectric layer(s) may be formed using PECVD, ALD, ICP, ECR, Cat-CVD, HWCVD, sputtering, or other suitable deposition techniques.

Figure 13:
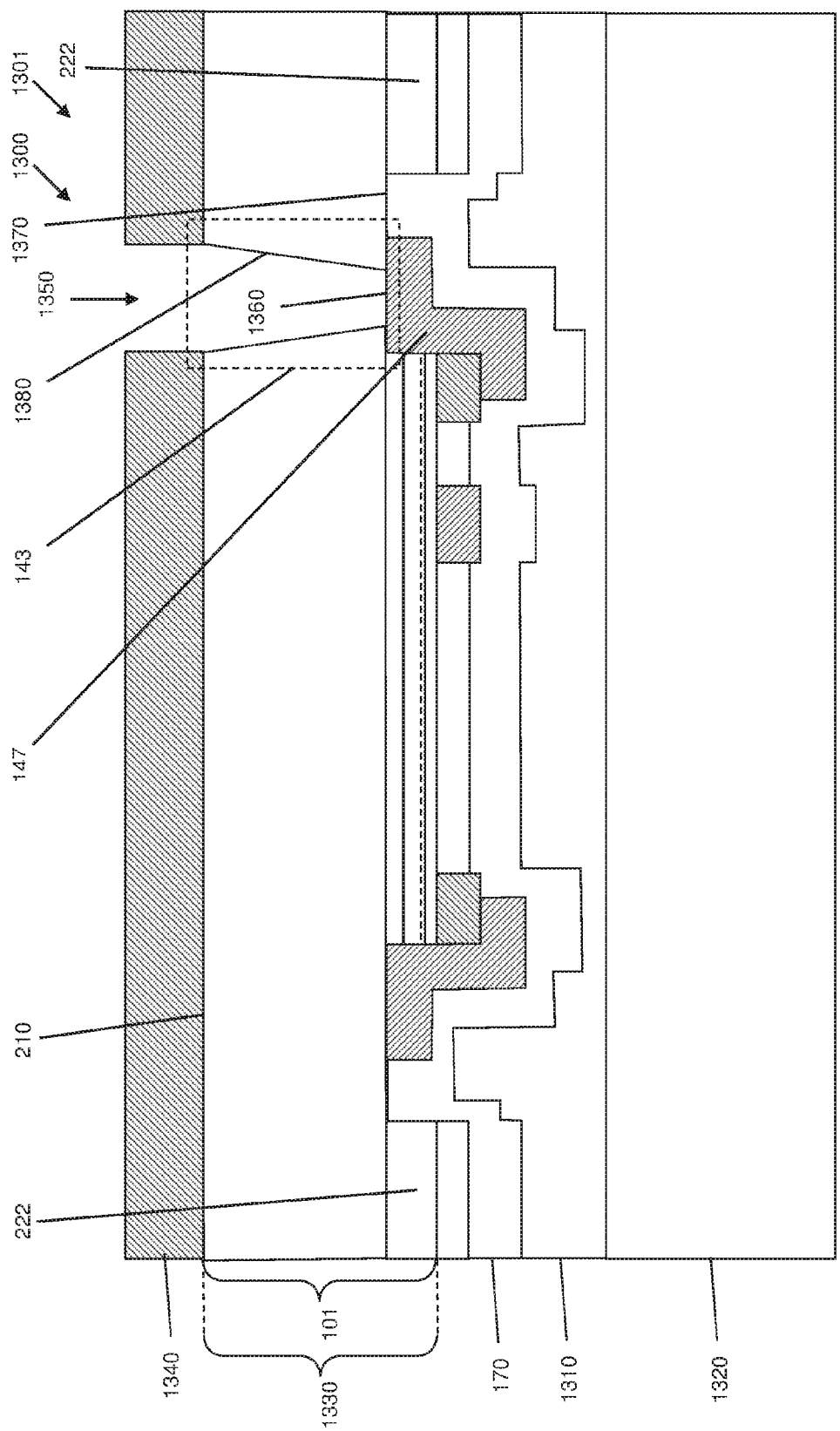

Referring now to FIG. 13 and step 1300, the method of fabricating GaN transistor 100, includes forming through wafer via 143 within semiconductor substrate 101. In an embodiment, structure 1201 of FIG. 12 is flipped over and mounted by adhesive layer 1310 to carrier substrate 1320. In an embodiment, semiconductor substrate 101 is then thinned to a final thickness 1330 exposing lower surface 210 of semiconductor substrate 101 using conventional grinding, lapping, and/or polishing techniques. In an embodiment, final thickness 1330 of semiconductor substrate 101 may be between about 500 and about 20,000 micro-inches though other thicknesses may be used. A suitable masking material 1340 is then applied to lower surface 210 of semiconductor substrate 101, according to an embodiment. The masking material may include Al, Ni, Cr, photo-resist, indium tin oxide (ITO) or other suitable materials. In an embodiment, one or more openings 1350, illustrated here as a single opening for clarity, is created in masking material 1340.

In an embodiment, through wafer via 143 is created by etching semiconductor substrate 101 in areas defined by opening(s) 1350. When etching is complete, through wafer via 143 extends from lower surface 210 of semiconductor substrate 101 and terminates on a bottom surface 1360 of interconnect metal 147. In other embodiments (not shown), through wafer via 143 may terminate on a lower surface 1370 of thermally conductive layer 170. In an embodiment, plasma etching techniques may be used to create through wafer via 143 in semiconductor substrate 101. These techniques may include reactive ion etching (RIE), inductively coupled plasma (ICP) etching, electron-cyclotron resonance (ECR) etching, or a combination of these techniques, though other suitable techniques may be used. The chemistries selected for the plasma etch techniques depend largely on the materials that comprise host substrate 202 and the semiconductor layers that may overlie host substrate 202. In an embodiment, host substrate 202 includes SiC and F-based etch chemistries such as $SF_6$, $C_2F_6$, $CF_4$, combinations of these, or other suitable chemistries may be used to etch host substrate 202. For embodiments that include GaN in high resistivity semiconductor layer 222, Cl-based etch chemistries such as Cl, $BCl_3$, combinations of these, or other suitable chemistries may be used. For both F-based and Cl-based etching, $O_2$ or Ar, or other suitable gases may be added to prevent polymer formation during etching. Structure 1301 results.

In some embodiments (not shown), bottom surface 1370 of thermally conductive layer 170 and sidewalls 1380 of through wafer via 143 may be coated with a thermally conductive backside layer. In these embodiments, the thermally conductive backside layer may be deposited by CVD or other suitable deposition techniques. The thermally conductive backside layer may include one or a combination of diamond, graphite, diamond-like materials, SiC, BN, Au, Cu, Al or other suitable high thermal conductivity materials(s). According to an embodiment, the thermally conductive backside layer may have a total thickness of between about 500 and about 20,000 angstroms, although other thickness values may be used. The thermally conductive backside layer may be formed using CVD, sputtering, or other suitable deposition techniques. According to an embodiment, through wafer via 143 is complete after cleaning up residual damage and defects on thermally conductive layer 170 and sidewalls 1380, and/or optionally depositing a thermally conductive back side layer.

Figure 14:
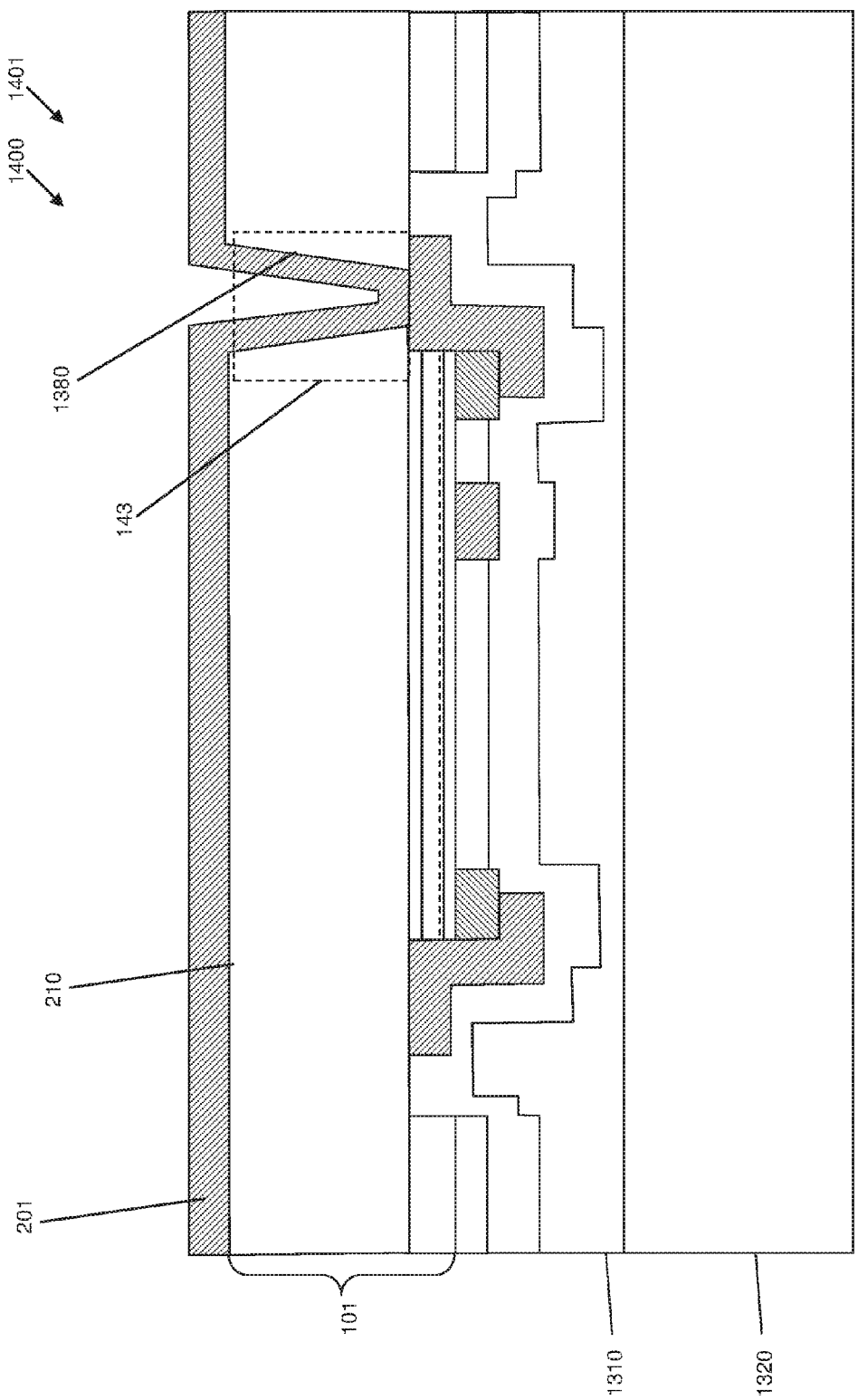

Referring now to FIG. 14 and step 1400, the method of fabricating GaN transistor 100, includes depositing back-metal layer 201 over lower surface 210 of semiconductor substrate 101 and coating sidewalls 1380 of through wafer via 143. In an embodiment, masking material 1340 is removed from structure 1301 of FIG. 13 after etching through wafer via 143 in substrate 101. In an embodiment, back-metal layer 201 is deposited over lower surface 210 of semiconductor substrate 101 using a first adhesion layer that contacts lower surface 210 and the sidewalls 1380 and bottom of through wafer via 143, and a second conductive layer that overlies the first adhesion layer. In an embodiment, the adhesion layer may be selected from Ti, Ni, Cr, Ti—W, Au, Cu, Al, a combination of these, or other materials that adhere to semiconductor substrate 101. In an embodiment, the adhesion layer may be deposited over lower surface 210 of semiconductor substrate 101 using one or more of sputtering, evaporation, electro-plating or other suitable technique(s). In an embodiment, the conductive layer may be selected from one of Au, Pd, Cu, Al, Sn, Au—Sn eutectic, a combination of these, or other materials that adhere to the adhesion layer and have sufficient electrical conductivity, thermal conductivity, and solder wetting properties. In an embodiment, the conductive layer may be deposited using one or more of sputtering, evaporation, electro-plating, electro-less plating, or other suitable technique(s). In some embodiments, a barrier layer may be inserted between the adhesion layer and the conductive layer to prevent solder applied to back metal layer 201 to consume the adhesion layer. The barrier layer may include one of vanadium (V), Ti, Ni, or other suitable materials. The barrier layer may be deposited by sputtering, evaporation, plating, or other suitable technique(s). Structure 1401 results.

Figure 15:
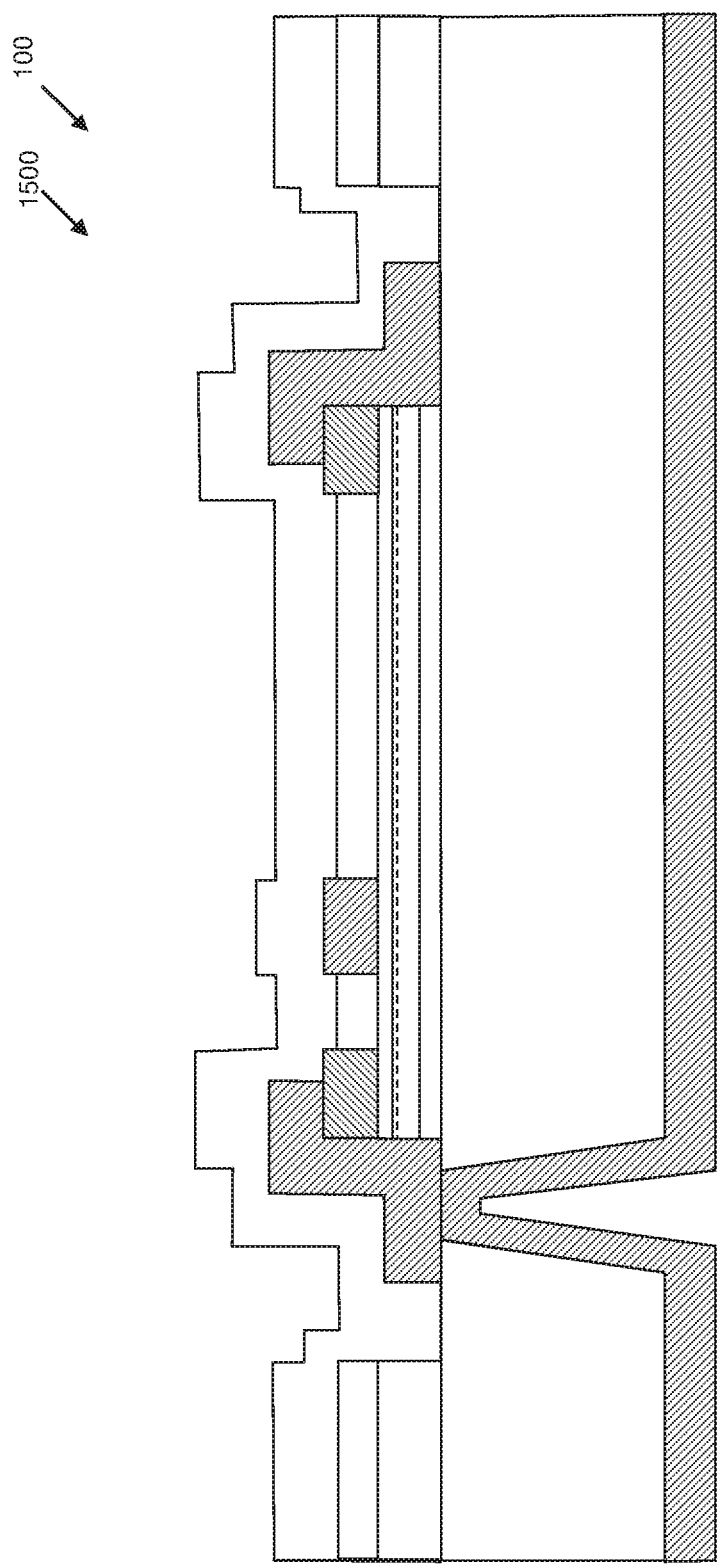

Referring now to FIG. 15 and step 1500, the method of fabricating GaN device 100, includes immersing structure 1401 from FIG. 14 in suitable solvents that dissolve adhesive layer 1310, thus separating semiconductor substrate 101 from carrier wafer 1320 of FIGS. 13-14. The finished GaN transistor 100 results.

Various embodiments of a semiconductor device have been disclosed. An embodiment of the semiconductor device includes a semiconductor substrate that includes a host substrate and an upper surface. The semiconductor device also includes active area proximate the upper surface of the semiconductor substrate, a substrate opening in the semiconductor substrate where a bottom of the substrate opening is defined by a recessed surface of the semiconductor substrate, and a thermally conductive layer disposed over the semiconductor substrate that extends between the recessed surface of the semiconductor substrate and a portion of the semiconductor substrate within the active area. In an embodiment, the semiconductor substrate may include a channel. An embodiment may include an isolation region that includes the substrate opening. An embodiment may include a gate electrode disposed over the upper surface of the semiconductor substrate that is electrically coupled to the channel. An embodiment may include a current-carrying electrode disposed over the upper surface of the semiconductor substrate and electrically coupled to the channel, where a heat generating region is present between the gate electrode and the current-carrying electrode, and the thermally conductive layer extends between the recessed surface of the semiconductor substrate and a portion of the semiconductor substrate over the heat generating region. The thermally conductive layer may include a substantially electrically insulating layer within the active area. In an embodiment, a thermal path distance between the heat generating region and the substrate opening may be less than 30 microns. In an embodiment, the thermally conductive layer comprises one or more material layers selected from diamond, silicon carbide, boron nitride, aluminum nitride, graphite, poly diamond, diamond-like materials, gold, silver, aluminum, or copper. In an embodiment, the thermally conductive layer has a thermal conductivity greater than 200 W/m-K. An embodiment may include a first dielectric layer between the thermally conductive layer and a portion of the semiconductor substrate that includes the channel. In an embodiment, the first dielectric layer may include one or more layers selected from silicon nitride, diamond, silicon carbide, boron nitride, aluminum nitride, graphite, poly diamond, or diamond-like materials. In an embodiment, the recessed surface is substantially co-planar with an upper surface of the host substrate. In an embodiment, the recessed surface is below an upper surface of the host substrate. In an embodiment, a through wafer via is formed between the substrate opening and a lower surface of the semiconductor substrate. In an embodiment, the through wafer via is lined with a back-metal layer. In an embodiment, the back-metal layer contacts the thermally conductive layer. In an embodiment, the thermal boundary resistance between the thermally conductive layer and the recessed surface is less than 30 square meters-Kelvin per gigawatt.

Another embodiment of the inventive subject matter may include a gallium nitride (GaN) transistor. According to an embodiment, the GaN transistor may include a host substrate that includes an upper surface and a channel, an active area that includes the channel, a gate electrode disposed over the upper surface of the semiconductor substrate in the active area and electrically coupled to the channel, a source electrode and a drain electrode disposed over the upper surface of the semiconductor substrate in the active area on opposite sides of the gate electrode and electrically coupled to the channel, a substrate opening in the semiconductor substrate where a bottom of the substrate opening is defined by a recessed surface of the semiconductor substrate, and a thermally conductive layer disposed over the semiconductor substrate that extends between the recessed surface of the semiconductor substrate and a portion of the semiconductor substrate within the active area. The thermally conductive layer may include a substantially electrically insulating layer within the active area.

An embodiment of a method of fabricating a semiconductor device includes fabricating a semiconductor device that includes providing a semiconductor substrate that includes a channel, creating an isolation region that defines an active area along an upper surface of the semiconductor substrate, forming a gate electrode over the semiconductor substrate over the channel in the active area, forming a source electrode and a drain electrode disposed over the upper surface of the semiconductor substrate in the active area on opposite sides of the gate electrode and electrically coupled to the channel, forming a substrate opening in the semiconductor substrate, where a bottom of the substrate opening is defined by a recessed surface of the semiconductor substrate, and depositing a thermally conductive layer over the semiconductor substrate that extends between the recessed surface of the semiconductor substrate and a portion of the semiconductor substrate over the channel. The thermally conductive layer may include a substantially electrically insulating layer within the active area. An embodiment of the method may include depositing a first dielectric layer over and in contact with the semiconductor substrate. The semiconductor may include a host substrate. An embodiment of the method may include forming the substrate opening so that the recessed surface is below an upper surface of the host substrate. An embodiment of the method may also include forming the substrate opening so that the recessed surface is above an upper surface of the host substrate.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For example, embodiments of the inventive subject matter may be realized in any semiconductor device technology (e.g. GaN or field effect transistor technologies). Other embodiments of the inventive subject matter may include technologies such as, but not limited to, bipolar junction transistor (BJT), heterojunction bipolar transistor (HBT), light emitting diode (LED), laser diode (LD), vertical cavity surface emitting lasers (VCSEL's), and other semiconductor device technologies in which a thermally conductive layer may be formed above a semiconductor substrate in order to thermally couple heat from a heat generating region within an active area to a thermal reservoir in of each of these exemplary semiconductor device technologies. For example, in the case of an HBT or BJT that includes a base, a collector, and an emitter, the corresponding heat generating region analogous to heat generating region 175 of FIG. 1 may be between the base and the collector of the HBT or BJT. A thermally conductive layer analogous to thermally conductive layer 170 of FIG. 1 may be applied over the base-collector junction in an embodiment of the inventive subject matter. Since LED's, LD's, and VCSEL's generate heat in the pn-junction region from which photons emit during operation, a thermally conductive layer analogous to thermally conductive layer 170 of FIG. 1 with appropriate optical properties (e.g., low loss) may be applied over the semiconductor substrate used to realize these devices. Likewise, substrate openings with recessed surfaces analogous to the substrate opening 160 and recessed surface of FIGS. 1 and 2 may be realized in each of these technologies to provide low thermal resistance connection between the respective heat generating regions and thermally conductive layers.

What is claimed is:

1. A semiconductor device comprising:
    a semiconductor substrate that includes a host substrate, a channel, an upper surface, and a lower surface;
    an active area proximate the upper surface of the semiconductor substrate;
    a substrate opening in the semiconductor substrate wherein a bottom of the substrate opening is defined by a recessed surface of the semiconductor substrate;
    a thermally conductive layer disposed over the semiconductor substrate and over the channel that contacts the recessed surface of the semiconductor substrate and extends between the recessed surface of the semiconductor substrate and a portion of the semiconductor substrate within the active area, the thermally conductive layer comprising a substantially electrically insulating layer within the active area;
    a through wafer via within the semiconductor substrate that includes a sidewall that extends from the lower surface of the semiconductor substrate to the recessed surface; and
    a high thermal conductivity backside layer in contact with the sidewall of the through wafer via.

2. The semiconductor device of claim 1, wherein the backside thermally conductive layer comprises a substantially electrically insulating layer.

3. The semiconductor device of claim 1, further comprising:
    a gate electrode disposed over the upper surface of the semiconductor substrate and electrically coupled to the channel; and
    a current-carrying electrode disposed over the upper surface of the semiconductor substrate and electrically coupled to the channel, wherein a heat generating region is present between the gate electrode and the current-carrying electrode, and the thermally conductive layer extends between the recessed surface of the semiconductor substrate and a portion of the semiconductor substrate over the heat generating region.

4. The semiconductor device of claim 3, wherein a thermal path distance between the heat generating region and the substrate opening is less than 30 microns.

5. The semiconductor device of claim 1, wherein the backside thermally conductive layer comprises one or more material layers selected from diamond, silicon carbide, boron nitride, aluminum nitride, graphite, poly diamond, diamond-like materials, gold, silver, aluminum, or copper.

6. The semiconductor device of claim 1, wherein the recessed surface is substantially co-planar with an upper surface of the host substrate.

7. The semiconductor device of claim 1, wherein the recessed surface is below an upper surface of the host substrate.

8. The semiconductor device of claim 1, wherein the backside thermally conductive layer contacts the thermally conductive layer.

9. The semiconductor device of claim 1, wherein a back-metal layer is disposed under the backside thermally conductive layer.

10. A gallium nitride (GaN) transistor comprising:
    a semiconductor substrate that includes a host substrate, an upper surface, and a channel;
    an active area that includes the channel;
    a gate electrode disposed over the upper surface of the semiconductor substrate in the active area and electrically coupled to the channel;
    a source electrode and a drain electrode disposed over the upper surface of the semiconductor substrate in the active area on opposite sides of the gate electrode and electrically coupled to the channel;
    a substrate opening in the semiconductor substrate wherein a bottom of the substrate opening is defined by a recessed surface of the semiconductor substrate;
    a thermally conductive layer disposed over the semiconductor substrate and over the channel that contacts the recessed surface of the semiconductor substrate and that extends between the recessed surface of the semiconductor substrate and a portion of the semiconductor substrate within the active area, the thermally conductive layer comprising a substantially electrically insulating layer within the active area;
    a through wafer via within the semiconductor substrate that includes a sidewall that extends from a lower surface of the semiconductor substrate to the recessed surface; and
    a high thermal conductivity backside layer in contact with the sidewall of the through wafer via.

11. An electrical apparatus comprising:
a semiconductor device that includes
   a semiconductor substrate that includes a host substrate, an upper surface, and a channel,
   an active area that includes the channel,
   a substrate opening in the semiconductor substrate wherein a bottom of the substrate opening is defined by a recessed surface of the semiconductor substrate,
   a thermally conductive layer disposed over the semiconductor substrate and over the channel that contacts the recessed surface of the semiconductor substrate and extends between the recessed surface of the semiconductor substrate and a portion of the semiconductor substrate within the active area, the thermally conductive layer comprising
a substantially electrically insulating layer within the active area, and
one or more bonding pads formed over the thermally conductive layer.

12. The electrical apparatus of claim 11 wherein the bonding pads contact the thermally conductive layer.

13. The electrical apparatus of claim 11 further comprising a bonding substrate in contact with the bonding pads.

14. The electrical apparatus of claim 13 wherein the bonding substrate comprises one of diamond, alumina, beryllium oxide, copper, gold, copper coin, or printed circuit board material.

15. The electrical apparatus of claim 13 wherein the bond pads are bonded to the bonding substrate using solder.

16. The electrical apparatus of claim 15 wherein the solder includes one of gold-tin eutectic, lead-tin solder, or silver sintering.

17. The electrical apparatus of claim 11 further comprising:
   a gate electrode disposed over the upper surface of the semiconductor substrate in the active area and electrically coupled to the channel and a source electrode and a drain electrode disposed over the upper surface of the semiconductor substrate in the active area on opposite sides of the gate electrode and electrically coupled to the channel.

18. The electrical apparatus of claim 17 wherein the bonding pads are electrically coupled to one or more of the gate electrode, the drain electrode, or the source electrode.

19. The electrical apparatus of claim 18 wherein the bonding pads are electrically isolated from one or more of the gate electrode, the drain electrode, or the source electrode.

* * * * *